US008883267B2

(12) United States Patent
Seo et al.

(10) Patent No.: US 8,883,267 B2
(45) Date of Patent: Nov. 11, 2014

(54) VAPOR DEPOSITION APPARATUS, VAPOR DEPOSITION METHOD, AND METHOD OF MANUFACTURING ORGANIC LIGHT-EMITTING DISPLAY APPARATUS

(75) Inventors: Sang-Joon Seo, Yongin (KR);
Myung-Soo Huh, Yongin (KR);
Seung-Hun Kim, Yongin (KR);
Jin-Kwang Kim, Yongin (KR);
Seung-Yong Song, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 105 days.

(21) Appl. No.: 13/431,880

(22) Filed: Mar. 27, 2012

(65) Prior Publication Data
US 2013/0017343 A1 Jan. 17, 2013

(30) Foreign Application Priority Data

Jul. 13, 2011 (KR) .................. 10-2011-0069489

(51) Int. Cl.
*C23C 16/04* (2006.01)
*C23C 16/50* (2006.01)
*C23C 16/458* (2006.01)
*C23C 16/455* (2006.01)

(52) U.S. Cl.
CPC ....... *C23C 16/45542* (2013.01); *C23C 16/4587* (2013.01); *C23C 16/45551* (2013.01)
USPC .......................... 427/569; 427/248.1; 118/715

(58) Field of Classification Search
None
See application file for complete search history.

(56) References Cited

U.S. PATENT DOCUMENTS

| 4,664,890 A * | 5/1987 | Tawada et al. ........... 422/186.05 |
| 2001/0007246 A1 | 7/2001 | Ueda et al. |
| 2002/0068458 A1 | 6/2002 | Chiang et al. |
| 2003/0138562 A1 * | 7/2003 | Subramony et al. ...... 427/255.28 |
| 2004/0089232 A1 * | 5/2004 | Sasaki et al. .................. 118/620 |
| 2005/0145181 A1 | 7/2005 | Dickinson |
| 2006/0249077 A1 * | 11/2006 | Kim et al. ............. 118/723 MP |
| 2006/0250084 A1 * | 11/2006 | Cok et al. ...................... 313/512 |

(Continued)

FOREIGN PATENT DOCUMENTS

| JP | 07-094417 | 4/1995 |
| KR | 10-2005-0071360 A | 7/2005 |

(Continued)

OTHER PUBLICATIONS

Extended EP Search Report issued on Oct. 30, 2012, for EP Application No. 12169161.2 (6 pages).
KIPO Notice of Allowance dated Jun. 24, 2013, for Korean priority Patent application 10-2011-0069489, (6 pages).

* cited by examiner

*Primary Examiner* — Joseph Miller, Jr.
(74) *Attorney, Agent, or Firm* — Christie, Parker & Hale, LLP

(57) ABSTRACT

A vapor deposition apparatus and method for efficiently performing a deposition process to form a thin film with improved characteristics on a substrate, and a method of manufacturing an organic light-emitting display apparatus. The vapor deposition apparatus includes a chamber including an exhaust port; a stage disposed in the chamber, and including a mounting surface on which the substrate is to be disposed; an injection portion including at least one injection opening through which a gas is injected in a direction parallel with a surface of the substrate on which the thin film is to be formed; and a plasma generator disposed apart from the substrate to face the substrate.

14 Claims, 11 Drawing Sheets

(56) References Cited

U.S. PATENT DOCUMENTS

| | | | |
|---|---|---|---|
| 2007/0004080 A1* | 1/2007 | Ouyang | 438/106 |
| 2008/0241384 A1* | 10/2008 | Jeong et al. | 427/255.29 |
| 2009/0162263 A1 | 6/2009 | Chang et al. | |
| 2009/0291232 A1 | 11/2009 | Washio et al. | |
| 2010/0068413 A1 | 3/2010 | Lee | |

FOREIGN PATENT DOCUMENTS

| | | |
|---|---|---|
| KR | 10-2006-0117607 A | 11/2006 |
| KR | 10-2010-0012115 A | 2/2010 |
| KR | 10-2010-0032315 A | 3/2010 |

VAPOR DEPOSITION APPARATUS, VAPOR DEPOSITION METHOD, AND METHOD OF MANUFACTURING ORGANIC LIGHT-EMITTING DISPLAY APPARATUS

CROSS-REFERENCE TO RELATED PATENT APPLICATION

This application claims priority to and the benefit of Korean Patent Application No. 10-2011-0069489, filed on Jul. 13, 2011, in the Korean Intellectual Property Office, the disclosure of which is incorporated herein in its entirety by reference.

BACKGROUND

1. Field of the Invention

Aspects of the present invention relate to a vapor deposition apparatus and method, and a method of manufacturing an organic light-emitting display apparatus.

2. Description of Related Art

Semiconductor devices, display apparatuses, and other electronic devices include a plurality of thin films. The plurality of thin films may be formed according to various methods, one of which is a vapor deposition method.

In the vapor deposition method, at least one gas is used to form a thin film. Examples of the vapor deposition method include chemical vapor deposition (CVD), atomic layer deposition (ALD), and the like.

Organic light-emitting display apparatuses have a larger viewing angle, better contrast characteristics, and a faster response rate than other comparable display apparatuses, and thus have drawn attention as next-generation display devices.

An organic light-emitting display apparatus includes an intermediate layer, which includes an organic emission layer, between a first electrode and a second electrode that are arranged opposite to each other, and further includes at least one thin film. A deposition process may be used to form the thin film in the organic light-emitting display apparatus.

As organic light-emitting display apparatuses are being developed to be larger and have higher resolution, it is difficult to deposit a large sized thin film with desired characteristics. Furthermore, there is a limitation in increasing efficiency for a process of forming such a thin film.

SUMMARY

Aspects of the present invention are directed toward a vapor deposition apparatus and method for efficiently performing a deposition process and improving characteristics of a deposited thin film, and a method of manufacturing an organic light-emitting display apparatus.

According to an embodiment of the present invention, there is provided a vapor deposition apparatus for forming a thin film on a substrate, the vapor deposition apparatus including a chamber having an exhaust port; a stage disposed in the chamber, and including a mounting surface on which the substrate is to be disposed; an injection portion having at least one injection opening through which a gas is injected in a direction parallel with a surface of the substrate on which the thin film is to be formed; and a plasma generator disposed apart from the substrate to face the substrate.

The plasma generator may include a supply portion via which a reaction gas is injected; a first plasma electrode; a second plasma electrode spaced apart from the first plasma electrode; and an outlet.

Plasma may be generated between the first and second plasma electrodes, and be discharged toward the substrate via the outlet of the plasma generator.

The plasma generator may include a plurality of modules. Each of the plurality of modules may include a supply portion via which the reaction gas is injected; a first plasma electrode; a second plasma electrode spaced apart from the first plasma electrode; and an outlet.

The plasma generator may be disposed to be parallel with the substrate.

The plasma generator may have the same size as the substrate to correspond to the substrate or may be larger than the substrate.

The vapor deposition apparatus may further include a mask having apertures for depositing a thin film in a desired pattern on the substrate. The mask may be disposed on the substrate.

The stage may include a plurality of mounting surfaces on which a plurality of substrates are to be respectively disposed.

The plurality of mounting surfaces may be positioned to be parallel with one another.

The plurality of mounting surfaces may be respectively located on a first surface of the stage and a second surface of the stage that is opposite to the first surface.

A plurality of plasma generators may be disposed to correspond to the plurality of substrates disposed on the plurality of mounting surfaces.

The vapor deposition apparatus may further include a driver for driving the stage and the plasma generator, and configured to move the substrate mounted on the stage and the plasma generator within the chamber.

The driver may move the stage and the plasma generator, to move the substrate mounted on the stage in a direction perpendicular to the surface of the substrate on which a thin film is to be deposited.

The driver makes a reciprocating movement.

The driver may concurrently or simultaneously move the stage and the plasma generator.

The driver may include a first driver for moving the stage; and a second driver for moving the plasma generator.

The mounting surface may be positioned in parallel with a direction in which a gravitational force acts.

The injection portion may be disposed farther from ground than the stage.

The exhaust port may be connected to a pump.

The at least one injection opening of the injection portion may be an outlet into which a source gas is injected.

The at least one injection hole of the injection portion may be an outlet via which a reaction gas is supplied to the plasma generator.

The exhaust port may be disposed closer to the ground than the substrate is disposed to the ground.

The injection portion may include a plurality of injection holes disposed apart from one another in a direction perpendicular to the surface of the substrate on which a thin film is deposited, so that a deposition process may be performed on the substrate several times.

According to another embodiment of the present invention, there is provided a vapor deposition method of forming a thin film on a substrate, the vapor deposition method including mounting the substrate on a mounting surface of a stage disposed in a chamber; injecting a source gas toward a space between the substrate and a plasma generator disposed to face the substrate via an injection portion and in a direction parallel with a surface of the substrate on which the thin film is to be deposited; performing an exhaust process by using an exhaust port of the chamber; generating plasma by using the plasma generator to discharge the plasma toward the substrate; and performing another exhaust process by using the exhaust port of the chamber.

The plasma generator may include a supply portion; a first plasma electrode; a second plasma electrode spaced apart from the first plasma electrode; and an outlet. A reaction gas may be supplied to the plasma generator via the supply portion, may be changed into plasma via the first and second plasma electrodes, and may be then discharged toward the substrate via the outlet of the plasma generator.

A reaction gas may be supplied to the plasma generator via the injection portion, be changed into plasma via the plasma generator, and be then discharged toward the substrate.

The injection portion may include an injection hole, and the source gas and the reaction gas may be sequentially injected via the injection hole.

The injection portion may include a plurality of injection holes, and the source gas and the reaction gas may be injected via different injection holes.

The exhaust process may be performed using a pump.

The mounting of the substrate may include disposing a mask on the substrate, wherein the mask has apertures for depositing a thin film in a desired pattern on the substrate.

A deposition process may be performed while the substrate mounted on the stage is being moved within the chamber in a direction perpendicular to the surface of the substrate on which the thin film is to be deposited.

The stage may include a plurality of mounting surfaces. During the mounting of the substrate on the stage, a plurality of substrates may be respectively mounted on the plurality of mounting surfaces of the stage.

A plurality of plasma generators may be disposed to correspond to the plurality of substrates.

According to another embodiment of the present invention, there is provided a method of manufacturing an organic light-emitting display apparatus in which a thin film at least including a first electrode, an intermediate layer having an organic emission layer, and a second electrode is formed on a substrate, wherein the forming of the thin film includes mounting the substrate on a mounting surface of a stage disposed in a chamber; injecting a source gas toward a space between the substrate and a plasma generator disposed to face the substrate via an injection portion and in a direction parallel with a surface of the substrate on which the thin film is to be deposited; performing an exhaust process by using an exhaust port of the chamber; generating plasma by using the plasma generator to discharge the plasma toward the substrate; and performing another exhaust process by using the exhaust port of the chamber.

The forming of the thin film may include forming an encapsulating layer on the second electrode.

The forming of the thin film may include forming an insulating layer.

The forming of the thin film may include forming a conductive layer.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Hereinafter, exemplary embodiments of the present invention will be described more fully with reference to the accompanying drawings.

Figure 1:
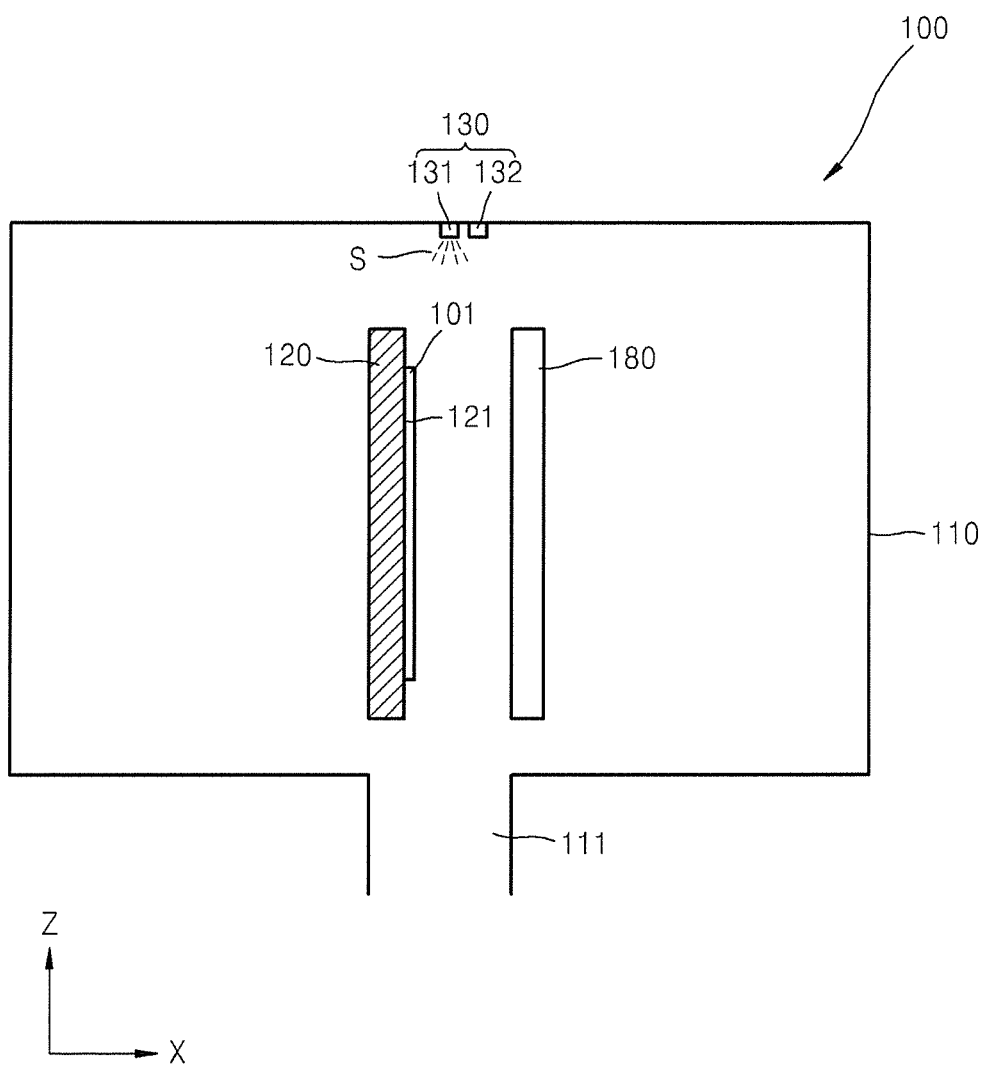
FIG. 1 is a schematic cross-section view of a vapor deposition apparatus according to an embodiment of the present invention.
Figure 2:
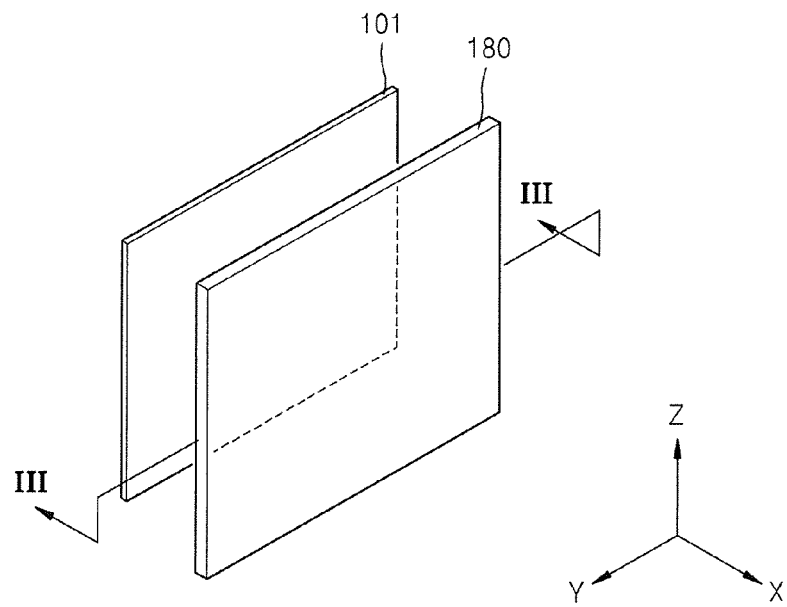
FIG. 2 is a schematic perspective view of a plasma generator of FIG. 1, according to an embodiment of the present invention.

FIG. 1 is a schematic cross-section view of a vapor deposition apparatus 100 according to an embodiment of the present invention. Referring to FIG. 1, the vapor deposition apparatus 100 includes a chamber 110, a stage 120, an injection portion 130, and a plasma generator 180.

The chamber 110 includes an exhaust port (e.g., an opening, a hole, etc.) 111 on a bottom thereof. The exhaust port 111 is an outlet via which a gas is exhausted, and may be connected to a pump (not shown) to help exhaust the gas.

Although not shown, the pump is used to control pressure applied to the chamber 110 so that the pressure is maintained constant. A heating unit (not shown) may be disposed inside or outside the chamber 110 to heat the inside of the chamber 110, thereby enhancing the efficiency of a deposition process.

The stage 120 is disposed in the chamber 110. The stage 120 includes a mounting surface 121. The mounting surface 121 is positioned in parallel with a direction in which a gravitational force acts. That is, the mounting surface 121 is perpendicular to the ground. To this end, the stage 120 is disposed perpendicularly to the ground.

A substrate 101 is disposed on the stage 120. Specifically, the substrate 101 is mounted on the mounting surface 121 of the stage 120.

A fixing unit (not shown) may be used to fix the mounted substrate 101 onto the mounting surface 121. Any of various members, e.g., a clamp, a pressurizing member, and an adhesive material, may be used as the fixing unit.

The plasma generator 180 is disposed to face the substrate 101. Specifically, the substrate 101 and the plasma generator 180 are disposed apart from each other to form a space therebetween. The plasma generator 180 may be disposed in parallel with the substrate 101. Also, the plasma generator 180 may have the same size as the substrate 101 to correspond to the substrate 101 or may be larger than the substrate 101.

The shape of the plasma generator 180 is not limited to the one as shown. In other words, the plasma generator 180 may have any of various shapes, provided that the plasma generator 180 can receive a reaction gas, generate plasma from the reaction gas, and discharge the plasma toward the substrate 101.

Figure 3:
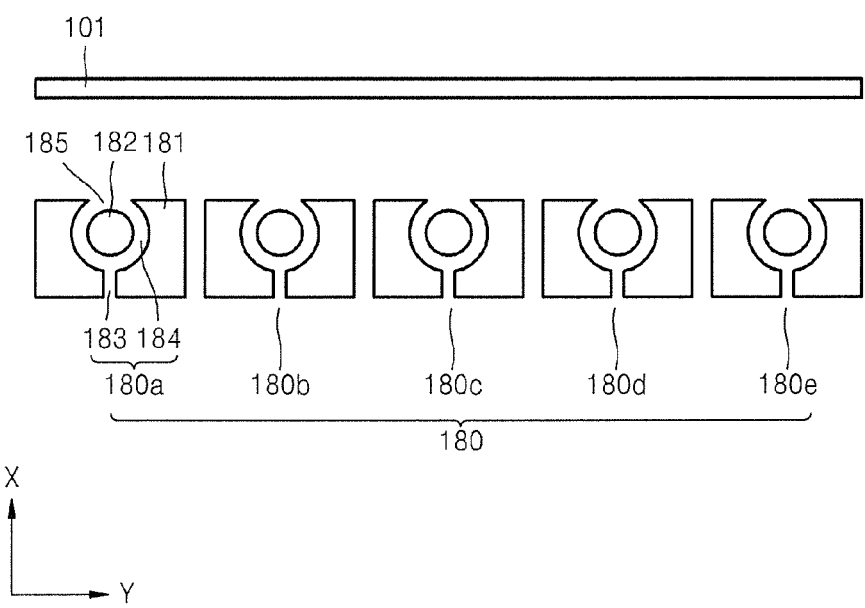
FIG. 3 is a cross-sectional view taken along a line III-III of FIG. 2.

The plasma generator 180 according to one embodiment is specifically illustrated in FIG. 3. Referring to FIG. 3, the plasma generator 180 includes a plurality of modules 180a, 180b, 180c, 180d, and 180e. The module 180a includes a first plasma electrode 181, a second plasma electrode 182, a supply portion 183, and an outlet 185. The other modules 180b, 180c, 180d, and 180e are the same as the module 180a and will not be described again here. FIG. 3 illustrates that the plurality of modules 180a, 180b, 180c, 180d, and 180e are disposed apart from one another, but aspects of the present invention are not limited thereto and the plurality of modules 180a, 180b, 180c, 180d, and 180e may be integrated together in one unit.

When a reaction gas is injected through the plasma generator 180 via the supply portion 183, plasma is generated in a space 184 between the first and second plasma electrodes 181 and 182 and is then discharged toward the substrate 101 via the outlet 185.

The injection portion 130 is connected to the chamber 110. At least one gas is injected toward the substrate 101 via the injection portion 130. Specifically, the injection portion 130 includes a first injection hole (or opening) 131 and a second injection hole 132. A gas is injected through the first and second injection holes 131 and 132 in a direction parallel with a planar surface of the substrate 101. In other words, a gas is injected through the first and second injection holes 131 and 132 in a direction parallel with a direction in which a gravitational force acts.

In detail, a source gas S is injected through the first injection hole 131. The second injection hole 132 may not need to be formed since a reaction gas that is in a plasma state is injected via the plasma generator 180. However, aspects of the present invention are not limited thereto, and the reaction gas may be injected through the second injection hole 132 rather than the supply portion 183 of the plasma generator 180. That is, the reaction gas may be injected through the second injection hole 132, be changed to the form of plasma within the plasma generator 180, and then be injected toward the substrate 101. Alternatively, if the second injection hole 132 is not formed, then the source gas S may be injected through the first injection hole 131, a suitable process (e.g., a predetermined process) may be performed using the source gas S, and then, the reaction gas may be injected through the first injection hole 131.

Shapes of the first and second injection holes 131 and 132 are not limited. For example, the first and second injection holes 131 and 132 may each be in the form of a dot or a line corresponding to a width of the first substrate 101.

An operation of the vapor deposition apparatus 100 according to the current embodiment is briefly described below.

The substrate 101 is mounted on the mounting surface 121 of the stage 120. Then, a source gas S is injected through the first injection hole 131 of the injection portion 130. In this case, the source gas S may be injected toward the space between the substrate 101 and the plasma generator 180. While the source gas S is being injected, the plasma generator 180 is controlled not to operate.

Specifically, the source gas S may contain aluminum (Al) atoms.

The source gas S is adsorbed onto the substrate 101. Then, an exhaust process is performed using the exhaust port 111 to form either a single atomic layer or multiple atomic layers of the source gas S on the substrate 101. That is, a single layer or multiple layers of the aluminum (Al) atoms are formed.

Then, a reaction gas is injected through the supply portion 183 of the plasma generator 180. Then, plasma is generated in the space 184 between the first and second plasma electrodes 181 and 182. The plasma is discharged toward the substrate 101 via the outlet 185.

Specifically, the reaction gas may contain oxygen (O) atoms. The plasma of the reaction gas is adsorbed onto an upper surface (e.g., a surface opposite to the surface facing the stage 120) of the substrate 101. Then, the exhaust process is performed using the exhaust port 111 to form either a single atomic layer or multiple atomic layers of the reaction gas on the substrate 101. In other words, a single layer or multiple layers of oxygen atoms are formed.

Accordingly, a single layer or multiple atomic layers of the source gas S and the reaction gas are formed on the substrate 101. In other words, an aluminum oxide layer AlxOy is formed, wherein x and y may be adjusted according to process conditions. In the current embodiment, a process of forming the aluminum oxide layer AlxOy is described for convenience of explanation, but aspects of the present invention are not limited thereto. That is, the present invention may be applied to a process of forming any of other various layers, e.g., an insulating layer and a conductive layer.

In the current embodiment, the source gas S is injected through the injection portion 130 in a direction parallel with the upper surface of the substrate 101. In particular, the substrate 101 is disposed perpendicularly to the ground, i.e., in a direction in which a gravitational force acts. Since the source gas S is supplied via the injection portion 130, it is possible to reduce an unnecessarily adsorbed amount on the substrate 101 when the source gas S is adsorbed onto the substrate 101. Similarly, it is possible to reduce an amount of the plasma generated by the plasma generator 180 that ends up being unnecessarily adsorbed onto the substrate 101.

In other words, an amount of surplus components adsorbed onto the substrate 101 or an uneven lump of the components drop downward due to gravity, thereby reducing the amounts of the surplus source gas S and the surplus plasma. Such surplus components may be easily removed by performing the exhaust process using the exhaust port 111 below the substrate 101 (e.g., the exhaust port 111 is disposed closer to the ground than the substrate 101 is disposed to the ground). Thus, the source gas S is injected through the first injection hole 131 of the injection portion 130, the exhaust process is performed without performing a purging process using an additional purge gas, the reaction gas is injected through the plasma generator 180, and the exhaust process is performed again without performing the purging process, thereby completing the deposition process.

In particular, in the current embodiment, the plasma generator 180 is disposed to face the substrate 101. The plasma generator 180 is disposed separately from the injection portion 130 via which the source gas S is injected. Thus, the process using the source gas S and the process using the reaction gas may be performed individually (independently), thereby easily forming a thin film that does not contain impurities.

Also, since the plasma generator 180 and the substrate 101 are disposed apart from each other and the source gas S is injected through the space therebetween via the injection portion 130, the plasma generator 180 may be used as a guide member to block undesired impurities. To this end, the plasma generator 180 may be formed to have the same size as or to be larger than the substrate 101.

Accordingly, the efficiency of the deposition process of forming a desired thin film may be greatly increased. Furthermore, since undesired components may be easily prevented or blocked from being adsorbed onto the substrate 101 and the purging process is not used, purge gas impurities generated when a purge gas is used may be eliminated from being deposited together with a desired thin film on the substrate 101. Therefore, it is possible to form a thin film having uniform characteristics that are physically and chemically improved.

Figure 4:
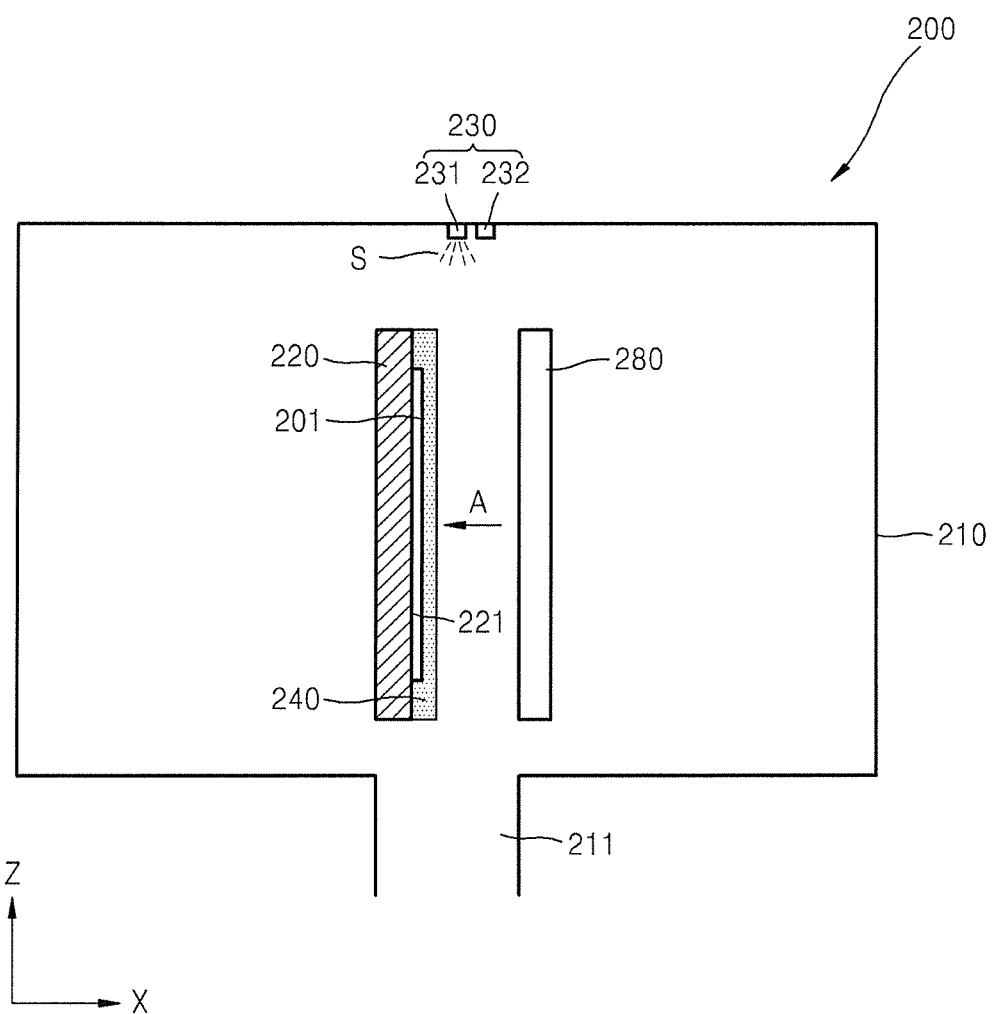
FIG. 4 is a schematic cross-section view of a vapor deposition apparatus according to another embodiment of the present invention.
Figure 5:
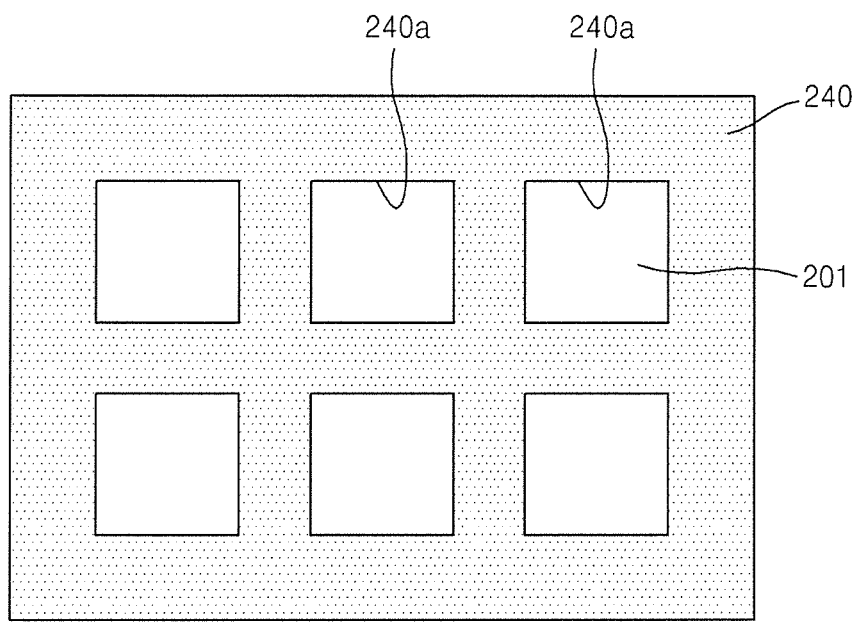
FIG. 5 is a plan view of the vapor deposition apparatus of FIG. 4, viewed in a direction indicated by an arrow A.

FIG. 4 is a schematic cross-section view of a vapor deposition apparatus 200 according to another embodiment of the present invention. FIG. 5 is a plan view of the vapor deposition apparatus 200 of FIG. 4, viewed in a direction indicated by an arrow A.

Referring to FIGS. 4 and 5, the vapor deposition apparatus 200 includes a chamber 210, a stage 220, an injection portion 230, a mask 240, and a plasma generator 280.

The chamber 210 includes an exhaust port 211 on a bottom thereof. The exhaust port 211 is an outlet via which a gas is exhausted, and may be connected to a pump (not shown) to help exhaust the gas.

Although not shown, the pump is used to control pressure applied to the chamber 210 so that the pressure is maintained constant. A heating unit (not shown) may be disposed inside or outside the chamber 210 to heat the inside of the chamber 210, thereby enhancing the efficiency of the deposition process.

The stage 220 is disposed in the chamber 210. The stage 220 includes a mounting surface 221. The mounting surface 221 is located to be parallel with a direction in which a gravitational force acts. That is, the mounting surface 221 is perpendicular to the ground. To this end, the stage 220 is disposed perpendicularly to the ground.

A substrate 201 is disposed on the stage 220. Specifically, the substrate 201 is mounted on the mounting surface 221 of the stage 220.

A fixing unit (not shown) may be used to fix the mounted substrate 201 onto the mounting surface 221. Any of various members, e.g., a clamp, a pressurizing member, and an adhesive material, may be used as the fixing unit.

The plasma generator 280 is disposed to face the substrate 201. Specifically, the substrate 201 and the plasma generator 280 are disposed apart from each other to form a space therebetween. The plasma generator 280 may be disposed in parallel with the substrate 201. Also, the plasma generator 280 may have the same size as the substrate 201 to correspond to the substrate 201 or may be larger than the substrate 201.

The mask 240 is disposed on the substrate 201. Referring to FIG. 5, the mask 240 includes a plurality of apertures 240a each having a suitable shape (e.g., a predetermined shape). Each of the plurality of apertures 240a has a shape corresponding to a respective one of patterns of a thin film to be formed on the substrate 201.

FIG. 5 illustrates a total of six apertures 240a, but aspects of the present invention are not limited thereto. The total number and shapes of the apertures 240a are determined based on the total number and shapes of patterns to be formed on the substrate 201. For example, the mask 240 may be an open type mask with one aperture 240a.

The shape of the plasma generator 280 is not limited to the one as shown. In other words, the plasma generator 280 may have any of various shapes, provided the plasma generator 280 can receive a reaction gas, generate plasma from the reaction gas, and discharge the plasma toward the substrate 201. For example, the plasma generator 280 may have the same structure as the plasma generator 180 of FIG. 3.

The injection portion 230 is connected to the chamber 210. At least one gas is injected toward the substrate 201 via the injection portion 230. Specifically, the injection portion 230 includes a first injection hole 231 and a second injection hole 232. A gas is injected through the first and second injection holes 231 and 232 in a direction parallel with a planar surface of the substrate 201. In other words, a gas is injected through the first and second injection holes 231 and 232 in a direction parallel with a direction in which a gravitational force acts.

In detail, a source gas S is injected through the first injection hole 231. The second injection hole 232 may not need to be formed since a reaction gas that is in a plasma state is injected via the plasma generator 280. However, aspects of the present invention are not limited thereto, and the reaction gas may be injected through the second injection hole 232 rather than a supply portion (not shown) of the plasma generator 280. That is, the reaction gas may be injected through the second injection hole 232, be changed to the form of plasma within the plasma generator 280, and then be injected toward the substrate 201.

Shapes of the first and second injection holes 231 and 232 are not limited. For example, the first and second injection holes 231 and 232 may each be in the form of a dot or a line corresponding to a width of the first substrate 201.

An operation of the vapor deposition apparatus 200 according to the current embodiment is briefly described below.

The substrate 201 is mounted on the mounting surface 221 of the stage 220. The mask 240 with the apertures 240a corresponding to the patterns of the thin film that is to be formed on the substrate 201, is disposed on the substrate 201.

Then, a source gas S is injected through the first injection hole 231 of the injection portion 230. In this case, the source gas S may be injected toward the space between the substrate 201 and the plasma generator 280. While the source gas S is being injected, the plasma generator 280 is controlled not to operate.

The source gas S is adsorbed onto the substrate 201. In particular, the source gas S is adsorbed onto regions on an upper surface of the substrate 201, which correspond to the apertures 240a. Then, an exhaust process is performed using the exhaust port 211 to form either a single atomic layer or multiple atomic layers of the source gas S on the regions on the substrate 201 corresponding to the apertures 240a.

Then, a reaction gas is injected through the supply portion of the plasma generator 280. When the reaction gas is injected, plasma is generated in the space between the first plasma electrode and the second plasma electrode. The plasma is discharged toward the substrate 201 via the outlet of the plasma generator 280.

The plasma of the reaction gas is adsorbed onto the regions on the substrate 201 corresponding to the apertures 240a. Then, the exhaust process is performed using the exhaust port 211 to form either a single atomic layer or multiple atomic layers of the reaction gas on the substrate 201.

Accordingly, a single layer or multiple atomic layers of the source gas S and the reaction gas are formed on the substrate 201.

In the current embodiment, the source gas S is injected through the injection portion 230 in a direction parallel with the upper surface of the substrate 201. In particular, the substrate 201 is disposed perpendicularly to the ground, i.e., in a direction in which a gravitational force acts. Since the source gas S is supplied via the injection portion 230, it is possible to reduce an unnecessarily adsorbed amount on the substrate 201 when the source gas S is adsorbed onto the substrate 201. Similarly, it is possible to reduce an amount of the plasma generated by the plasma generator 280 that ends up being unnecessarily adsorbed onto the substrate 201.

In other words, an amount of surplus components adsorbed onto the substrate 201 or an uneven lump of the components drop downward due to gravity, thereby reducing the amounts of the surplus source gas S and the surplus plasma. Such surplus components may be easily removed by performing the exhaust process using the exhaust port 211 below the substrate 201. Thus, the source gas S is injected through the first injection hole 231 of the injection portion 230, the exhaust process is performed without performing a purging process using an additional purge gas, the reaction gas is injected through the plasma generator 280, and the exhaust process is performed again without performing the purging process, thereby completing the deposition process.

In particular, in the current embodiment, the plasma generator 280 is disposed to face the substrate 201. The plasma generator 280 is disposed separately from the injection portion 230 via which the source gas S is injected. Thus, the process using the source gas S and the process using the reaction gas may be performed individually, thereby easily forming a thin film that does not contain impurities.

Also, since the plasma generator 280 and the substrate 201 are disposed apart from each other and the source gas S is injected through the space therebetween via the injection portion 230, the plasma generator 280 may be used as a guide member to block undesired impurities. To this end, the plasma generator 280 may be formed to have the same size as or to be larger than the substrate 201.

Also, in the current embodiment, the mask 240 is disposed on the substrate 201 to help form the patterns of a thin film on the substrate 201.

Accordingly, the efficiency of the deposition process of forming a desired thin film may be greatly increased. Furthermore, since undesired components may be easily prevented or blocked from being adsorbed onto the substrate 201 and the purging process is not used, purge gas impurities generated when a purge gas is used may be eliminated from being deposited together with a desired thin film on the substrate 201. Therefore, it is possible to form a thin film having uniform characteristics that are physically and chemically improved.

Figure 6:
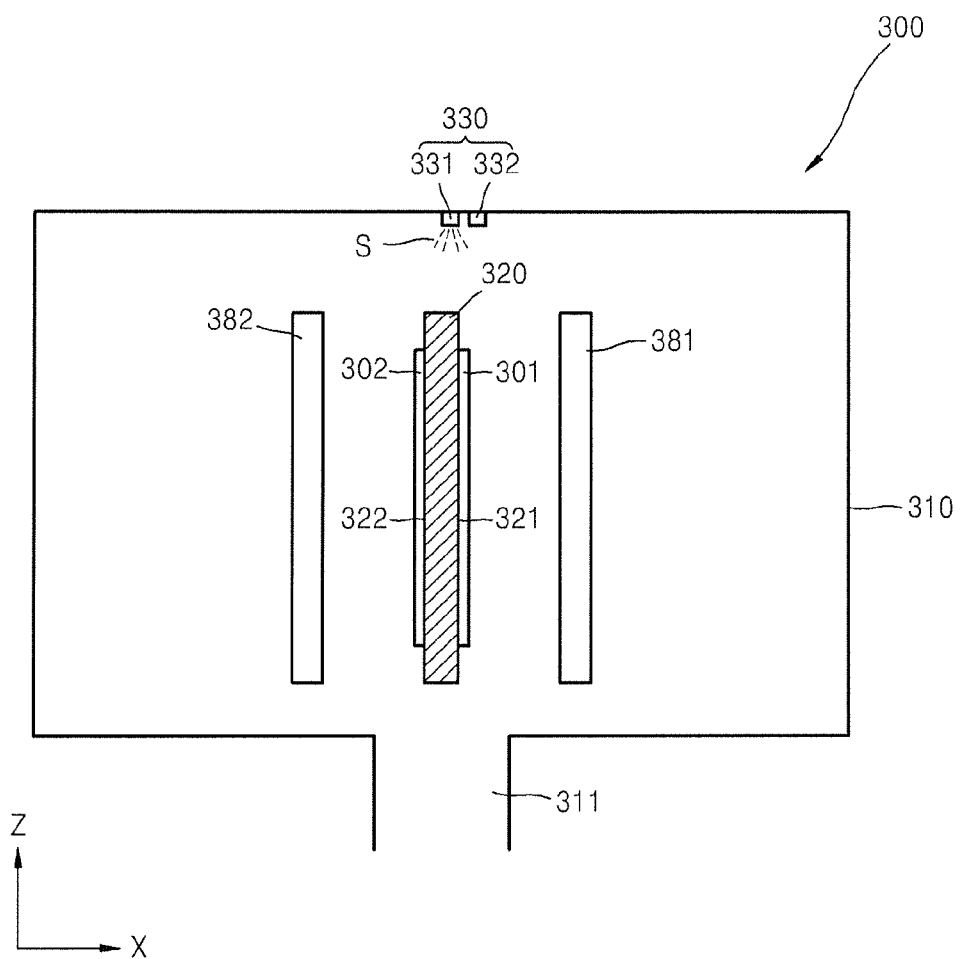
FIG. 6 is a schematic cross-section view of a vapor deposition apparatus according to another embodiment of the present invention.

FIG. 6 is a schematic cross-section view of a vapor deposition apparatus 300 according to another embodiment of the present invention. Referring to FIG. 6, the vapor deposition apparatus 300 includes a chamber 310, a stage 320, an injection portion 330, a first plasma generator 381, and a second plasma generator 382.

The chamber 310 includes an exhaust port 311 on a bottom thereof. The exhaust port 311 is an outlet via which a gas is exhausted, and may be connected to a pump (not shown) to help exhaust the gas.

Although not shown, the pump is used to control pressure applied to the chamber 310 so that the pressure is maintained constant. A heating unit (not shown) may be disposed inside or outside the chamber 310 to heat the inside of the chamber 310, thereby enhancing the efficiency of a deposition process.

The stage 320 includes a first mounting surface 321 and a second mounting surface 322. The first and second mounting surfaces 321 and 322 are located to be parallel with a direction in which a gravitational force acts. In other words, the first and second mounting surfaces 321 and 322 are located perpendicularly to the ground. To this end, the stage 320 is disposed perpendicularly to the ground.

A first substrate 301 and a second substrate 302 are disposed on the stage 320. Specifically, the first substrate 301 and the second substrate 302 are respectively mounted on the first mounting surface 321 and the second mounting surface 322 of the stage 320.

The first and second mounting surfaces 321 and 322 are located to be parallel with each other.

A fixing unit (not shown) may be used to respectively fix the mounted first and second substrates 301 and 302 onto the first and second mounting surfaces 321 and 322. Any of various members, e.g., a clamp, a pressurizing member, and an adhesive material, may be used as the fixing unit.

The first and second plasma generators 381 and 382 are disposed to face the first and second substrates 301 and 302. Specifically, the first and second plasma generators 381 and 382 are respectively disposed to face the first and second substrates 301 and 302.

The first substrate 301 and the first plasma generator 381 are disposed apart from each other to form a space therebetween, and the second substrate 302 and the second plasma generator 382 are disposed apart from each other to form a space therebetween. The first and second plasma generators 381 and 382 may be disposed in parallel with the first and second substrates 301 and 302, respectively. Also, the first plasma generator 381 may have the same size as the first substrate 301 to correspond to the first substrate 301 or may be larger than the first substrate 301, and the second plasma generator 382 may have the same size as the second substrate 302 to correspond to the second substrate 301 or may be larger than the second substrate 302. Shapes of the first and second plasma generators 381 and 382 are not limited. In other words, the first and second plasma generators 381 and 382 may have any of various shapes, provided they can receive a reaction gas, generate plasma from the reaction gas, and respectively discharge the plasma toward the first and second substrates 301 and 302. The first and second plasma generators 381 and 382 are as described above in the previous embodiments and are thus not described in detail here.

The injection portion 330 is connected to the chamber 310. At least one gas is injected toward the substrate 301 via the injection portion 330. Specifically, the injection portion 330 includes a first injection hole 331 and a second injection hole 332. A gas is injected through the first and second injection holes 331 and 332 in a direction parallel with planar surfaces of the first and second substrates 301 and 302. In other words, a gas is injected through the first and second injection holes 331 and 332 in a direction parallel with a direction in which a gravitational force acts.

In detail, a source gas S is injected through the first injection hole 331. The second injection hole 332 may not need to be formed since a reaction gas that is in a plasma state is injected via the first and second plasma generators 381 and 382. However, aspects of the present invention are not limited thereto, and the reaction gas may be injected through the second injection hole 332 rather than supply portions (not shown) of the first and second plasma generators 381 and 382.

Shapes of the first and second injection holes 331 and 332 are not limited. For example, the first and second injection holes 331 and 332 may each be in the form of a dot or a line corresponding to a width of the first substrate 301.

An operation of the vapor deposition apparatus 300 according to the current embodiment is briefly described below.

The first and second substrates 301 and 302 are respectively mounted on the first and second mounting surfaces 321 and 322 of the stage 320. Then, a source gas S is injected through the first injection hole 333 of the injection portion 330. In this case, the source gas S may be injected toward the space between the first substrate 301 and the first plasma generator 381, and the space between the second substrate 302 and the second plasma generator 382. While the source gas S is being injected, the first and second plasma generators 381 and 382 are controlled not to operate.

The source gas S is adsorbed onto upper surfaces of the first and second substrates 301 and 302. Then, an exhaust process is performed using the exhaust port 311 to form either a single atomic layer or multiple atomic layers of the source gas S on the first and second substrates 301 and 302.

Then, a reaction gas is injected through the supply portions of the first and second plasma generators 381 and 382. When the reaction gas is injected, plasma is generated in the space between the first plasma electrode and the second plasma electrode. The plasma is discharged toward the first and second substrates 301 and 302 via the outlets of the plasma generators 381 and 382.

Thus, the plasma of the reaction gas is adsorbed onto the first and second substrates 301 and 302. Then, the exhaust process is performed using the exhaust port 311 to form either a single atomic layer or multiple atomic layers of the reaction gas on the first and second substrates 301 and 302.

Accordingly, a single atomic layer or multiple atomic layers of the source gas S and the reaction gas are formed on the first and second substrates 301 and 302.

In the current embodiment, the source gas S is injected through the injection portion 330 in a direction parallel with the upper surfaces of the first and second substrates 301 and 302. In particular, the first and second substrates 301 and 302 are disposed perpendicularly to the ground, i.e., in a direction in which a gravitational force acts. Thus, when the source gas S is supplied via the injection portion 330 to be adsorbed onto the first and second substrates 301 and 302, it is possible to reduce an unnecessarily adsorbed amount on the first and second substrates 301 and 302 when the source gas S is adsorbed onto the first and second substrates 301 and 302. Similarly, it is possible to reduce an amount of the plasma generated by the first and second plasma generators 381 and 382 that ends up being unnecessarily adsorbed onto the first and second substrates 301 and 302.

In other words, an amount of surplus components adsorbed onto the first and second substrates 301 and 302 or an uneven lump of the components drop downward due to gravity, thereby reducing the amounts of the surplus source gas S and the surplus plasma. Such surplus components may also be easily removed by performing the exhaust process using the exhaust port 311 below the first and second substrates 301 and 302. Thus, the source gas S is injected through the first injection hole 331 of the injection portion 330, the exhaust process is performed without performing a purging process using an additional purge gas, the reaction gas is injected through the first and second plasma generators 381 and 382, and the exhaust process is performed again without performing the purging process, thereby completing the deposition process.

In particular, in the current embodiment, the first and second plasma generators 381 and 382 are disposed to face the first and second substrates 301 and 302, respectively. The first and second plasma generators 381 and 382 are disposed separately from the injection portion 330 via which the source gas S is injected. Thus, the process using the source gas S and the process using the reaction gas may be performed individually, thereby easily forming a thin film that does not contain impurities.

Also, the first and second plasma generators 381 and 382 are disposed apart from the first and second substrate 301 and 302 and the source gas S is injected through the spaces between the first plasma generator 381 and the first substrate 301, and between the second plasma generator 382 and the second substrate 301 via the injection portion 330. Thus, the first and second plasma generators 381 and 382 may be used as guide members to block undesired impurities. To this end, the first and second plasma generators 381 and 382 may be formed to have the same size as or to be larger than the first and second substrates 301 and 302.

Accordingly, the efficiency of the deposition process of forming a desired thin film may be greatly increased. Furthermore, since undesired components may be easily prevented or blocked from being adsorbed onto the first and second substrates 301 and 302 and the purging process is not used, purge gas impurities generated when a purge gas is used may be eliminated from being deposited together with thin films on the first and second substrates 301 and 302. Therefore, it is possible to form a thin film having uniform characteristics that are physically and chemically improved.

Also, in the current embodiment, the first and second mounting surfaces 321 and 322 are respectively formed on both surfaces of the stage 320, and the first and second substrates 301 and 302 are concurrently or simultaneously mounted on the stage 320. Accordingly, the efficiency of the deposition process may be enhanced. Furthermore, since the first and second substrates 301 and 302 are respectively disposed on both surfaces of the stage 320 to be parallel with each other, surfaces of the first and second substrates 301 and 302 on which a thin film is to be formed are not disposed to face each other. Thus, a deposition process performed on the first substrate 301 and a deposition process performed on the second substrate 302 are not influenced by each other. Accordingly, it is possible to form a thin film having uniform and improved characteristics on both the first and second substrates 301 and 302.

Figure 7:
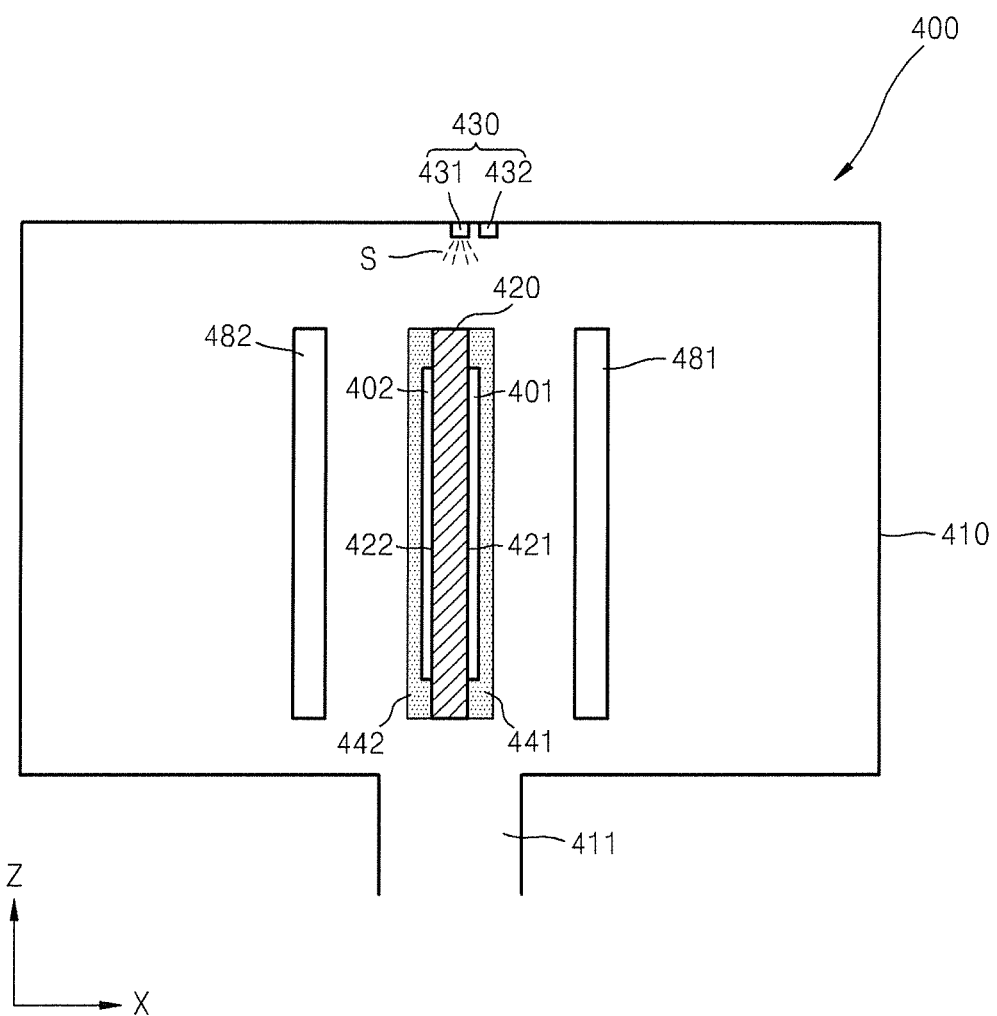
FIG. 7 is a schematic cross-sectional view of a vapor deposition apparatus 400 according to another embodiment of the present invention.

FIG. 7 is a schematic cross-sectional view of a vapor deposition apparatus 400 according to another embodiment of the present invention. Referring to FIG. 7, the vapor deposition apparatus 400 includes a chamber 410, a stage 420, an injection portion 430, a first mask 441, a second mask 442, a first plasma generator 481, and a second plasma generator 482.

The chamber 410 includes an exhaust port 411 on a bottom thereof. The exhaust port 411 is an outlet via which a gas is exhausted, and may be connected to a pump (not shown) to help exhaust the gas.

Although not shown, the pump is used to control pressure applied to the chamber 410 so that the pressure is maintained constant. A heating unit (not shown) may be disposed inside or outside the chamber 410 to heat the inside of the chamber 410, thereby enhancing the efficiency of a deposition process.

The stage 420 includes a first mounting surface 421 and a second mounting surface 422. The first and second mounting surfaces 421 and 422 are located to be parallel with a direction in which a gravitational force acts. In other words, the first and second mounting surfaces 421 and 422 are located perpendicularly to the ground. To this end, the stage 420 is disposed perpendicularly to the ground.

A first substrate 401 and a second substrate 402 are disposed on the stage 420. Specifically, the first substrate 401 and the second stage 402 are respectively mounted on the first mounting surface 421 and the second mounting surface 422 of the stage 420.

The first and second mounting surfaces 421 and 422 are located to be parallel with each other.

A fixing unit (not shown) may be used to respectively fix the mounted first and second substrates 401 and 402 onto the first and second mounting surfaces 421 and 422. Any of various members, e.g., a clamp, a pressurizing member, and an adhesive material, may be used as the fixing unit.

The first and second masks 441 and 442 are disposed on the first and second substrates 401 and 402. Specifically, the first and second masks 441 and 442 may be respectively disposed on the first and second substrates 401 and 402.

Although not shown, each of the first and second masks 441 and 442 includes apertures as in the previous embodiments. Each of the apertures has a shape corresponding to a respective one of patterns of a thin film to be formed on each of the first and second substrates 401 and 402.

The first and second plasma generators 481 and 482 are disposed to face the first and second substrates 401 and 402. Specifically, the first and second plasma generators 481 and 482 are respectively disposed to face the first and second substrates 401 and 402, respectively.

The first substrate 401 and the first plasma generator 481 are disposed apart from each other to form a space therebetween, and the second substrate 402 and the second plasma generator 482 are disposed apart from each other to form a space therebetween. The first and second plasma generators 481 and 482 may be disposed in parallel with the first and second substrates 401 and 402, respectively. Also, the first plasma generator 481 may have the same size as the first substrate 401 to correspond to the first substrate 401 or may be larger than the first substrate 401, and the second plasma generator 482 may have the same size as the second substrate 402 to correspond to the second substrate 402 or may be larger than the second substrate 402.

The shapes of the first and second plasma generators 481 and 482 are not limited. In other words, the first and second plasma generators 481 and 482 may have any of various shapes, provided they can receive a reaction gas, generate plasma from the reaction gas, and respectively discharge the plasma toward the first and second substrates 401 and 402. The first and second plasma generators 481 and 482 are as described above in the previous embodiments and are thus not described in detail here.

The injection portion 430 is connected to the chamber 410. At least one gas is injected toward the substrate 401 via the injection portion 430. Specifically, the injection portion 430 includes a first injection hole 431 and a second injection hole 432. A gas is injected through the first and second injection holes 431 and 432 in a direction parallel with a planar surface of the substrate 401. In other words, a gas is injected through the first and second injection holes 431 and 432 in a direction parallel with a direction in which a gravitational force acts.

In detail, a source gas S is injected through the first injection hole 431. The second injection hole 432 may not need to be formed since a reaction gas that is in a plasma state is injected via the first and second plasma generators 481 and 482. However, aspects of the present invention are not limited thereto, and the reaction gas may be injected through the second injection hole 432 rather than supply portions (not shown) of the first and second plasma generators 481 and 482.

Shapes of the first and second injection holes 431 and 432 are not limited. For example, the first and second injection holes 431 and 432 may each be in the form of a dot or a line corresponding to a width of the first substrate 401.

An operation of the vapor deposition apparatus 400 according to the current embodiment is briefly described below.

The first and second substrates 401 and 402 are respectively mounted on the first and second mounting surfaces 421 and 422 of the stage 420. The first mask 441 including apertures (not shown) corresponding to patterns of a thin film that is to be deposited on the first substrate 401, is disposed on the first substrate 402. The second mask 442 including apertures (not shown) corresponding to patterns of a thin film that is to be deposited on the second substrate 402, is disposed on the second substrate 402.

Then, a source gas S is injected through the first injection hole 431 of the injection portion 430. In this case, the source gas S may be injected toward the space between the first substrate 401 and the first plasma generator 481, and the space between the second substrate 402 and the second plasma generator 482. While the source gas S is being injected, the first and second plasma generators 481 and 482 are controlled not to operate.

The source gas S is adsorbed onto upper surfaces of the first and second substrates 401 and 402. In particular, the source gas S is adsorbed onto regions on the first and second substrates 401 and 402, which correspond to the apertures. Then, an exhaust process is performed using the exhaust port 411 to form either a single atomic layer or multiple atomic layers of the source gas S on the regions of the first and second substrates 401 and 402 which correspond to the apertures.

Then, a reaction gas is injected through the supply portions of the first and second plasma generators 481 and 482. When the reaction gas is injected, plasma is generated in the space between the first plasma electrode and the second plasma electrode. The plasma is discharged toward the first and second substrates 401 and 402 via the outlets of the plasma generators 481 and 482.

The plasma of the reaction gas is adsorbed onto the regions on the first and second substrates 401 and 402 corresponding to the apertures. Then, the exhaust process is performed using the exhaust port 411 to form either a single atomic layer or multiple atomic layers of the reaction gas on the first and second substrates 401 and 402.

Accordingly, a single atomic layer or multiple atomic layers of the source gas S and the reaction gas are formed on the first and second substrates 401 and 402.

In the current embodiment, the source gas S is injected through the injection portion 430 in a direction parallel with the upper surfaces of the first and second substrates 401 and 402. In particular, the first and second substrates 401 and 402 are disposed perpendicularly to the ground, i.e., in a direction in which a gravitational force acts. Thus, when the source gas S is supplied via the injection portion 430 to be adsorbed onto the first and second substrates 401 and 402, it is possible to reduce an unnecessarily adsorbed amount on the first and second substrates 401 and 402 when the source gas S is adsorbed onto the first and second substrates 401 and 402. Similarly, it is possible to reduce an amount of the plasma generated by the first and second plasma generators 481 and 482 that ends up being unnecessarily adsorbed onto the first and second substrates 401 and 402.

In other words, an amount of surplus components adsorbed onto the first and second substrates 401 and 402 or an uneven lump of the components drop downward due to gravity, thereby reducing the amounts of the surplus source gas S and the surplus plasma. Such surplus components may also be easily removed by performing the exhaust process using the exhaust port 411 below the first and second substrates 401 and 402. Thus, the source gas S is injected through the first injection hole 431 of the injection portion 430, the exhaust process is performed without performing a purging process using an additional purge gas, the reaction gas is injected through the first and second plasma generators 481 and 482, and the exhaust process is performed again without performing the purging process, thereby completing the deposition process.

In particular, in the current embodiment, the first and second plasma generators 481 and 482 are disposed to face the first and second substrates 401 and 402, respectively. The first and second plasma generators 481 and 482 are disposed separately from the injection portion 430 via which the source gas S is injected. Thus, the process using the source gas S and the process using the reaction gas may be performed individually, thereby easily forming a thin film that does not contain impurities.

Also, the first and second plasma generators 481 and 482 are disposed apart from the first and second substrate 401 and 402, and the source gas S is injected through the spaces between the first plasma generator 481 and the first substrate 801 and between the second plasma generator 482 and the second substrate 402 via the injection portion 430. Thus, the first and second plasma generators 481 and 482 may be used as guide members to block undesired impurities. To this end, the first and second plasma generators 481 and 482 may be formed to have the same size as or to be larger than the first and second substrates 401 and 402.

Also, in the current embodiment, the first and second masks 441 and 442 are disposed on the first and second substrates 401 and 402 to help form the patterns of thin films on the first and second substrates 401 and 402.

Accordingly, the efficiency of the deposition process of forming a desired thin film may be greatly increased. Furthermore, since undesired components may be easily prevented or blocked from being adsorbed onto the first and second substrates 401 and 402 and the purging process is not used, purge gas impurities generated when a purge gas is used may be eliminated from being deposited together with thin films on the first and second substrates 401 and 402. Therefore, it is possible to form a desired thin film having uniform characteristics that are physically and chemically improved.

Also, in the current embodiment, the first and second mounting surfaces 421 and 422 are respectively formed on both surfaces of the stage 420, and the first and second substrates 401 and 402 are concurrently or simultaneously mounted on the stage 420. Accordingly, the efficiency of the deposition process may be enhanced. Furthermore, since the first and second substrates 401 and 402 are disposed on both surfaces of the stage 420 to be parallel with each other, surfaces of the first and second substrates 401 and 402 on which a thin film is to be formed are not disposed to face each other. Thus, a deposition process performed on the first substrate 401 and a deposition process performed on the second substrate 402 are not influenced by each other. Accordingly, it is possible to form a thin film having uniform and improved characteristics on both the first and second substrates 401 and 402.

Figure 8:
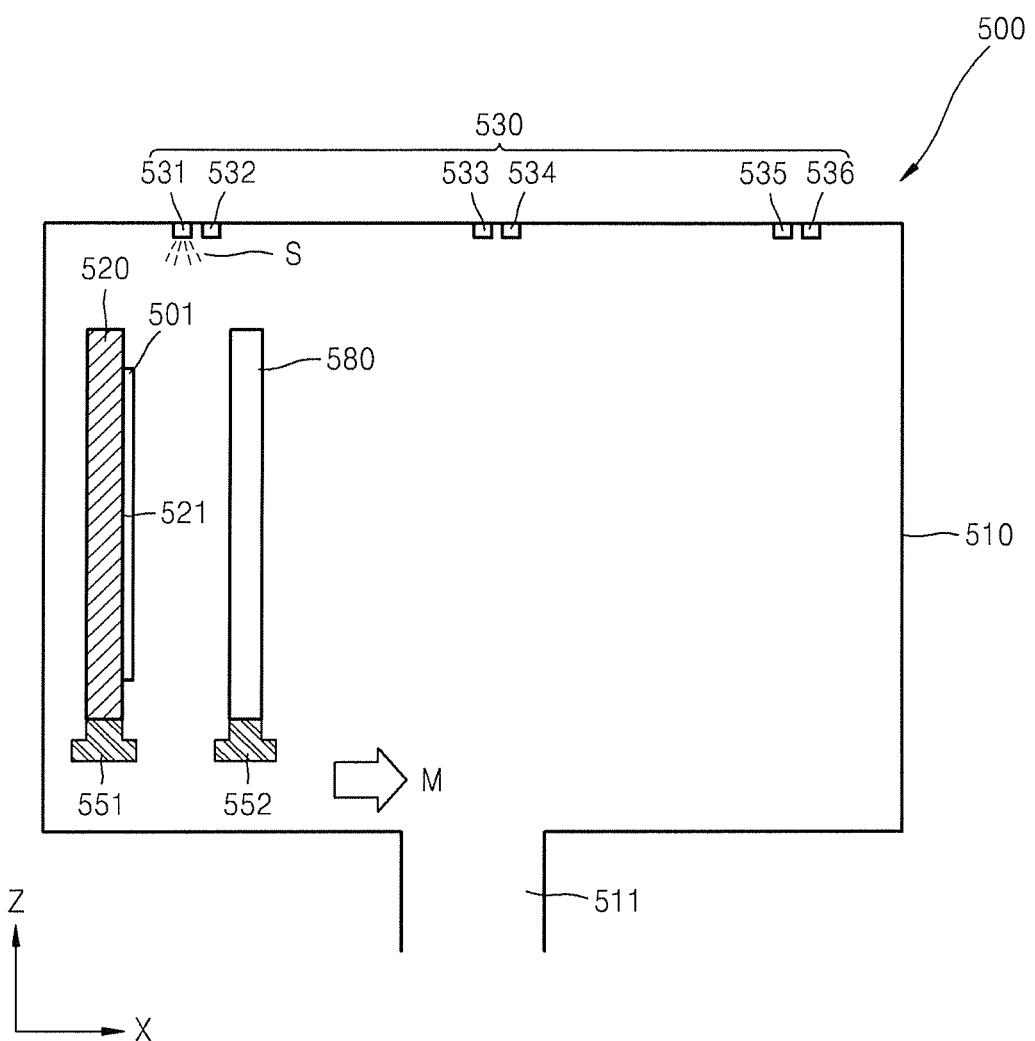
FIG. 8 is a schematic cross-section view of a vapor deposition apparatus according to another embodiment of the present invention.

FIG. 8 is a schematic cross-section view of a vapor deposition apparatus 500 according to another embodiment of the present invention. Referring to FIG. 8, the vapor deposition apparatus 500 includes a chamber 510, a stage 520, an injection portion 530, a first driver 551, a second driver 552, and a plasma generator 580.

The chamber 510 includes an exhaust port 511 on a bottom thereof. The exhaust port 511 is an outlet via which a gas is exhausted, and may be connected to a pump (not shown) to help exhaust the gas.

Although not shown, the pump is used to control pressure applied to the chamber 510 so that the pressure is maintained constant. A heating unit (not shown) may be disposed inside or outside the chamber 510 to heat the inside of the chamber 510, thereby enhancing the efficiency of a deposition process.

The stage 520 is disposed in the chamber 510. The stage 520 includes a mounting surface 521. The mounting surface 521 is located to be parallel with a direction in which a gravitational force acts. That is, the mounting surface 521 is perpendicular to the ground. To this end, the stage 520 is disposed perpendicularly to the ground.

A substrate 501 is disposed on the stage 520. Specifically, the substrate 501 is mounted on the mounting surface 521 of the stage 520.

A fixing unit (not shown) may be used to fix the mounted substrate 501 onto the mounting surface 521. Any of various members, e.g., a clamp, a pressurizing member, and an adhesive material, may be used as the fixing unit.

The plasma generator 580 is disposed to face the substrate 501. Specifically, the substrate 501 and the plasma generator 580 are disposed apart from each other to form a space therebetween. The plasma generator 580 may be disposed in parallel with the substrate 501. Also, the plasma generator 580 may have the same size as the substrate 501 to correspond to the substrate 501 or may be larger than the substrate 501.

The shape of the plasma generator 580 is not limited. In other words, the plasma generator 580 may have any of various shapes, provided that the plasma generator 580 can receive a reaction gas, generate plasma from the reaction gas, and discharge the plasma toward the substrate 501. The structure of the plasma generator 580 is the same as in the previous embodiments and is thus not described in detail here.

The first and second drivers 551 and 552 are connected to the stage 520 and the plasma generator 580. Specifically, the first driver 551 is connected to the stage 520, and the second driver 552 is connected to the plasma generator 580. FIG. 8 illustrates two separate drivers, i.e., the first and second drivers 551 and 552, but aspects of the present invention are not limited thereto. In other words, one driver may be used to concurrently or simultaneously move the stage 520 and the plasma generator 580.

Referring to FIG. 8, the first driver 551 moves the stage 520 in a direction indicated by an arrow M or a direction opposite to that direction. In other words, the first driver 551 moves the stage 520 in the X-axis direction. Thus, the substrate 501 may be moved in a direction perpendicular to a surface of the substrate 501 on which a thin film is to be formed.

The second driver 552 moves the plasma generator 580 in the direction indicated by the arrow M or the direction opposite to that direction. In other words, the second driver 552 moves the plasma generator 580 in the X-axis direction. Thus, the plasma generator 580 may be moved in the direction perpendicular to the surface of the substrate 501 on which a thin film is to be formed.

In this case, the first and second drivers 551 and 552 are controlled to maintain a space between the substrate 501 and the plasma generator 580 constant.

The injection portion 530 is connected to the chamber 510. At least one gas is injected toward the substrate 501 via the injection portion 530. Specifically, the injection portion 530 includes a first injection hole 531, a second injection hole 532, a third injection hole 533, a fourth injection hole 534, a fifth injection hole 535, and a sixth injection hole 536.

The first to sixth injection holes 531 to 536 are arranged in a direction in which the substrate 501 is moved. In other words, the first to sixth injection holes 531 to 536 are disposed apart from one another in the X-axis direction.

Shapes of the first to sixth injection holes 531 to 536 are not limited. For example, they may each be in the form of a dot or a line corresponding to a width of the substrate 501.

Specifically, a gas is injected through the first to sixth injection holes 531 to 536 in a direction parallel with a planar surface of the substrate 501. In other words, a gas is injected through the first to sixth injection holes 531 to 536 in a direction parallel with a direction in which a gravitational force acts.

Specifically, a source gas S is sequentially or concurrently or simultaneously injected through the first, third, and fifth injection holes 531, 533, and 535. The second, fourth, and sixth injection holes 532, 534, and 536 may not need to be formed since a reaction gas that is in a plasma state is injected via the plasma generator 580. However, aspects of the present invention are not limited thereto, and the reaction gas may be injected through the second, fourth, and sixth injection holes 532, 534, and 536 rather than a supply portion (not shown) of the plasma generator 580. That is, the reaction gas may be injected through the second, fourth, and sixth injection holes 532, 534, and 536, be changed to the form of plasma within the plasma generator 580, and then be injected toward the substrate 501.

An operation of the vapor deposition apparatus 500 according to the current embodiment is briefly described below.

The substrate 501 is mounted on the mounting surface 521 of the stage 520. Then, a source gas S is injected through the first injection hole 531 of the injection portion 530. In this case, the source gas S may be injected toward the space between the substrate 501 and the plasma generator 580. While the source gas S is being injected, the plasma generator 580 is controlled not to operate.

The source gas S is adsorbed onto the substrate 501. Then, an exhaust process is performed using the exhaust port 511 to form either a single atomic layer or multiple atomic layers of the source gas S on the substrate 501.

Then, a reaction gas is injected through the supply portion of the plasma generator 580. When the reaction gas is injected, plasma is generated in the space between the first plasma electrode and the second plasma electrode. The plasma is discharged toward the substrate 501 via the outlet of the plasma generator 580.

Thus, the plasma of the reaction gas is adsorbed onto the substrate 501. Then, the exhaust process is performed using the exhaust port 511 to form either a single atomic layer or multiple atomic layers of the reaction gas on the substrate 501.

Accordingly, a single layer or multiple atomic layers of the source gas S and the reaction gas are formed on the substrate 501.

Then, the stage 520 and the plasma generator 580 are moved using the first and second drivers 551 and 552 in the X-axis direction, i.e., the direction indicated by the arrow M. Accordingly, the space between the substrate 501 and the plasma generator 580 is maintained constant, even after the substrate 601 and the plasma generator 680 are moved.

Then, a source gas S is injected through the third injection hole 533 of the injection portion 530. In this case, the source gas S may be injected toward the space between the substrate 501 and the plasma generator 580. While the source gas S is being injected, the plasma generator 580 is controlled not to operate.

The source gas S is adsorbed onto the substrate 501. Then, an exhaust process is performed using the exhaust port 511 to form either a single atomic layer or multiple atomic layers of the source gas S on the substrate 501.

Then, a reaction gas is injected through the supply portion of the plasma generator 580. When the reaction gas is injected, plasma is generated in the space between the first plasma electrode and the second plasma electrode. The plasma is discharged toward the substrate 501 via the outlet of the plasma generator 580.

Thus, the plasma of the reaction gas is adsorbed onto the substrate 501. Then, the exhaust process is performed using the exhaust port 511 to form either a single atomic layer or multiple atomic layers of the reaction gas on the substrate 501.

Accordingly, the single atomic layer of or multiple atomic layers of the source gas S and the reaction gas are further formed on the thin film, i.e., the single atomic layer or multiple atomic layers of the source gas S and the reaction gas, which was formed on the substrate 501 by using the first injection hole 531 and the plasma generator 580 before the first and second drivers 551 and 552 were driven.

Then, the stage 520 and the plasma generator 580 are moved in the X-axis direction, i.e., the direction indicated by the arrow M, by using the first and second drivers 551 and 552.

Then, a thin film is additionally formed on the substrate 501 by using the fifth injection hole 535 and the plasma generator 580 in the same manner in which the previous thin film was formed using the first injection hole 531 and the plasma generator 580.

Accordingly, it is possible to form a thin film to a desired thickness on the substrate 501 in the chamber 510. In other words, moving of the stage 520 and the plasma generator 580 may be controlled according to the desired thickness of the thin film.

In the current embodiment, the source gas S is injected through the injection portion 530 in a direction parallel with the upper surface of the substrate 501. In particular, the substrate 501 is disposed perpendicularly to the ground, i.e., in a direction in which a gravitational force acts. Since the source gas S is supplied via the injection portion 530, it is possible to reduce an unnecessarily adsorbed amount on the substrate 501 when the source gas S is adsorbed onto the substrate 501. Similarly, it is possible to reduce an amount of the plasma generated by the plasma generator 580 that ends up being unnecessarily adsorbed onto the substrate 501.

In other words, an amount of surplus components adsorbed onto the substrate 501 or an uneven lump of the components drop downward due to gravity, thereby reducing the amounts of the surplus source gas S and the surplus plasma. Such surplus components may be easily removed by performing the exhaust process using the exhaust port 511 below the substrate 501. Thus, the source gas S is injected through the first injection hole 531 of the injection portion 530, the exhaust process is performed without performing a purging process using an additional purge gas, the reaction gas is injected through the plasma generator 580, and the exhaust process is performed again without performing the purging process, thereby completing the deposition process.

In particular, in the current embodiment, the plasma generator 580 is disposed to face the substrate 501. The plasma generator 580 is disposed separately from the injection portion 530 via which the source gas S is injected. Thus, the process using the source gas S and the process using the reaction gas may be performed individually, thereby easily forming a thin film that does not contain impurities.

Also, since the plasma generator 580 and the substrate 501 are disposed apart from each other and the source gas S is injected through the space therebetween via the injection portion 530, the plasma generator 580 may be used as a guide member to block undesired impurities. To this end, the plasma generator 580 may be formed to have the same size as or to be larger than the substrate 501. For example, when the source gas S is injected through the third injection hole 533, a surplus impurity gas generated and adsorbed onto the substrate 501 when the source gas S injected through the first injection hole 531 reacts with the substrate 501 may not be completely exhausted via the exhaust port 511. In this case, a process using the source gas S injected via the third injection hole 533 may be influenced by the surplus impurity gas, thereby degrading the characteristics of a thin film to be formed on the substrate 501. However, according to the current embodiment, the source gas S is injected toward the space between the substrate 501 and the plasma generator 580 via the third injection hole 533. Thus, the plasma generator 580 may prevent or block the source gas S from being mixed with such a surplus impurity gas.

Accordingly, the efficiency of the deposition process of forming a desired thin film may be greatly increased. Furthermore, since undesired components may be easily prevented or blocked from being adsorbed onto the first and second substrates 501 and 502 and the purging process is not used, purge gas impurities generated when a purge gas is used may be eliminated from being deposited together with a desired thin film on the first and second substrates 501 and 502. Therefore, it is possible to form a thin film having uniform characteristics that are physically and chemically improved.

Also, in the current embodiment, a deposition process is performed while the stage 520 and the plasma generator 580 are being moved using the first and second drivers 551 and 552. Also, a plurality of deposition processes are sequentially performed using the first injection hole 531, the third injection hole 533, the fifth injection hole 535, and the plasma generator 580. Thus, it is possible to greatly reduce an amount of time required to form a thin film to a desired thickness, thereby increasing the efficiency of the deposition process.

Figure 9:
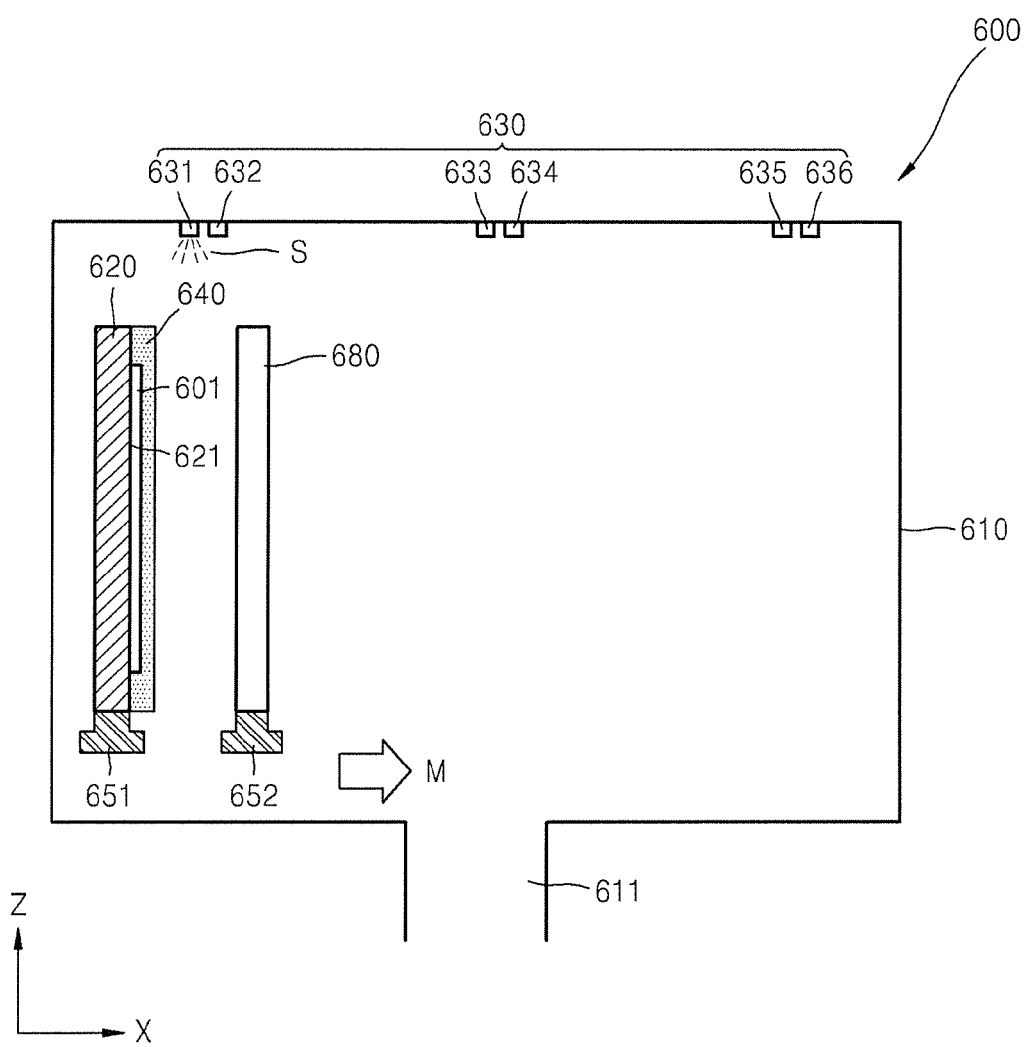
FIG. 9 is a schematic cross-section view of a vapor deposition apparatus according to another embodiment of the present invention.

FIG. 9 is a schematic cross-section view of a vapor deposition apparatus 600 according to another embodiment of the present invention. Referring to FIG. 9, the vapor deposition apparatus 600 includes a chamber 610, a stage 620, an injection portion 630, a mask 640, a first driver 651, a second driver 652, and a plasma generator 680.

The chamber 610 includes an exhaust port 611 on a bottom thereof. The exhaust port 611 is an outlet via which a gas is exhausted, and may be connected to a pump (not shown) to help exhaust the gas.

Although not shown, the pump is used to control pressure applied to the chamber 610 so that the pressure is maintained constant. A heating unit (not shown) may be disposed inside or outside the chamber 610 to heat the inside of the chamber 610, thereby enhancing the efficiency of a deposition process.

The stage 620 is disposed in the chamber 610. The stage 620 includes a mounting surface 621. The mounting surface 621 is located to be parallel with a direction in which a gravitational force acts. That is, the mounting surface 621 is perpendicular to the ground. To this end, the stage 620 is disposed perpendicularly to the ground.

A substrate 601 is disposed on the stage 620. Specifically, the substrate 601 is mounted on the mounting surface 621 of the stage 620.

A fixing unit (not shown) may be used to fix the mounted substrate 601 onto the mounting surface 621. Any of various members, e.g., a clamp, a pressurizing member, and an adhesive material, may be used as the fixing unit.

The mask 640 is disposed on the substrate 601. The mask 640 includes apertures (not shown) formed in a suitable pattern (e.g., a predetermined pattern). Each of the apertures has a shape corresponding to a respective one of patterns of a thin film to be formed on the substrate 601.

The plasma generator 680 is disposed to face the substrate 601. Specifically, the substrate 601 and the plasma generator 680 are disposed apart from each other to form a space therebetween. The plasma generator 680 may be disposed in parallel with the substrate 601. Also, the plasma generator 680 may have the same size as the substrate 601 to correspond to the substrate 601 or may be larger than the substrate 601.

A shape of the plasma generator 680 is not limited. In other words, the plasma generator 680 may have any of various shapes, provided the plasma generator 680 can receive a reaction gas, generate plasma from the reaction gas, and discharge the plasma toward the substrate 601. The structure of the plasma generator 680 is the same as in the previous embodiments and is thus not described in detail here.

The first and second drivers 651 and 652 are connected to the stage 620 and the plasma generator 680. Specifically, the first driver 651 is connected to the stage 620, and the second driver 652 is connected to the plasma generator 680. FIG. 9 illustrates two separate drivers, i.e., the first and second drivers 651 and 652, but aspects of the present invention are not limited thereto. In other words, one driver may be used to concurrently or simultaneously move the stage 620 and the plasma generator 680.

Referring to FIG. 9, the first driver 651 moves the stage 620 in a direction indicated by an arrow M or a direction opposite to that direction. In other words, the first driver 651 moves the stage 620 in the X-axis direction. Thus, the substrate 601 may be moved in a direction perpendicular to a surface of the substrate 601 on which a thin film is to be formed.

The second driver 652 moves the plasma generator 680 in the direction indicated by the arrow M or the direction opposite to that direction. In other words, the second driver 652 moves the plasma generator 680 in the X-axis direction. Thus, the plasma generator 680 may be moved in the direction perpendicular to the surface of the substrate 601 on which a thin film is to be formed.

In this case, the first and second drivers 651 and 652 are controlled to maintain a space between the substrate 601 and the plasma generator 680 constant.

The injection portion 630 is connected to the chamber 610. At least one gas is injected toward the substrate 601 via the injection portion 630. Specifically, the injection portion 630 includes a first injection hole 631, a second injection hole 632, a third injection hole 633, a fourth injection hole 634, a fifth injection hole 635, and a sixth injection hole 636.

The first to sixth injection holes 631 to 636 are arranged in a direction in which the substrate 601 is moved. In other words, the first to sixth injection holes 631 to 636 are disposed apart from one another in the X-axis direction.

Shapes of the first to sixth injection holes 631 to 632 are not limited. For example, they may each be in the form of a dot or a line corresponding to a width of the substrate 601.

Specifically, a gas is injected through the first to sixth injection holes 631 to 636 in a direction parallel with a planar surface of the substrate 601. In other words, a gas is injected through the first to sixth injection holes 631 to 636 in a direction parallel with a direction in which a gravitational force acts.

Specifically, a source gas S is sequentially or concurrently or simultaneously injected through the first, third, and fifth injection holes 631, 633, and 635. The second, fourth, and sixth injection holes 632, 634, and 636 may not need to be formed since a reaction gas that is in a plasma state is injected via the plasma generator 680. However, aspects of the present invention are not limited thereto, and the reaction gas may be injected through the second, fourth, and sixth injection holes 632, 634, and 636 rather than a supply portion (not shown) of the plasma generator 680. That is, the reaction gas may be injected through the second, fourth, and sixth injection holes 632, 634, and 636, be changed to the form of plasma within the plasma generator 680, and then be injected toward the substrate 601.

An operation of the vapor deposition apparatus 600 according to the current embodiment is briefly described below.

The substrate 601 is mounted on the mounting surface 621 of the stage 620. The mask 640 with apertures corresponding to patterns of a thin film that is to be formed on the substrate 601, is disposed on the substrate 601.

Then, a source gas S is injected through the first injection hole 631 of the injection portion 630. In this case, the source gas S may be injected toward the space between the substrate 601 and the plasma generator 680. While the source gas S is being injected, the plasma generator 680 is controlled not to operate.

The source gas S is adsorbed onto the substrate 601. In particular, the source gas S is adsorbed onto regions on the substrate 601 that correspond to the apertures. Then, an exhaust process is performed using the exhaust port 611 to form either a single atomic layer or multiple atomic layers of the source gas S on the substrate 601.

Then, a reaction gas is injected through the supply portion of the plasma generator 680. When the reaction gas is injected, plasma is generated in the space between the first plasma electrode and the second plasma electrode. The plasma is discharged toward the substrate 601 via the outlet of the plasma generator 680.

The plasma of the reaction gas is adsorbed onto the regions on the substrate 601 corresponding to the apertures. Then, the exhaust process is performed using the exhaust port 611 to form either a single atomic layer or multiple atomic layers of the reaction gas on the substrate 601.

Accordingly, a single layer or multiple atomic layers of the source gas S and the reaction gas are formed on the substrate 601.

Then, the stage 620 and the plasma generator 680 are moved in the X-axis direction, i.e., the direction indicated by the arrow M, by using the first and second drivers 651 and 652. Accordingly, the space between the substrate 601 and the plasma generator 680 is maintained constant even after the substrate 601 and the plasma generator 680 are moved.

Then, a source gas S is injected through the third injection hole 633 of the injection portion 630. In this case, the source gas S may be injected toward the space between the substrate 601 and the plasma generator 680. While the source gas S is being injected, the plasma generator 680 is controlled not to operate.

The source gas S is adsorbed onto the substrate 601. Then, an exhaust process is performed using the exhaust port 611 to form either a single atomic layer or multiple atomic layers of the source gas S on the substrate 601.

Then, a reaction gas is injected through the supply portion of the plasma generator 680. When the reaction gas is injected, plasma is generated in the space between the first plasma electrode and the second plasma electrode. The plasma is discharged toward the substrate 601 via the outlet of the plasma generator 680.

Thus, the plasma of the reaction gas is adsorbed onto the substrate 601. Then, the exhaust process is performed using the exhaust port 611 to form either a single atomic layer or multiple atomic layers of the reaction gas on the substrate 601.

Accordingly, a single atomic layer or multiple atomic layers of the source gas S and the reaction gas are formed on the thin film, i.e., the single atomic layer of or multiple atomic layers of the source gas S and the reaction gas, which was formed on the substrate 601 by using the first injection hole 631 and the plasma generator 680 before the first and second drivers 651 and 652 were driven.

Then, the stage 620 and the plasma generator 680 are moved in the X-axis direction, i.e., the direction indicated by the arrow M, by using the first and second drivers 651 and 652.

Then, a thin film is additionally formed on the substrate 601 by using the fifth injection hole 635 and the plasma generator 680 in the same manner in which the previous thin film was formed using the first injection hole 631 and the plasma generator 680.

Accordingly, it is possible to form a thin film to a desired thickness on the substrate 601 in the chamber 610. In other words, moving of the stage 620 and the plasma generator 680 may be controlled according to the desired thickness of the thin film.

In the current embodiment, the source gas S is injected through the injection portion 630 in a direction parallel with the upper surface of the substrate 601. In particular, the substrate 601 is disposed perpendicularly to the ground, i.e., in a direction in which a gravitational force acts. Since the source gas S is supplied via the injection portion 630, it is possible to reduce an unnecessarily adsorbed amount on the substrate 601 when the source gas S is adsorbed onto the substrate 601. Similarly, it is possible to reduce an amount of the plasma generated by the plasma generator 680 that ends up being unnecessarily adsorbed onto the substrate 601.

In other words, an amount of surplus components adsorbed onto the substrate 601 or an uneven lump of the components drop downward due to gravity, thereby reducing the amounts of the surplus source gas S and the surplus plasma. Such surplus components may be easily removed by performing the exhaust process using the exhaust port 611 below the substrate 601. Thus, the source gas S is injected through the first injection hole 631 of the injection portion 630, the exhaust process is performed without performing a purging process using an additional purge gas, the reaction gas is injected through the plasma generator 680, and the exhaust process is performed again without performing the purging process, thereby completing the deposition process.

In particular, in the current embodiment, the plasma generator 680 is disposed to face the substrate 601. The plasma generator 680 is disposed separately from the injection portion 630 via which the source gas S is injected. Thus, the process using the source gas S and the process using the reaction gas may be performed individually, thereby easily forming a thin film that does not contain impurities.

Also, since the plasma generator 680 and the substrate 601 are disposed apart from each other and the source gas S is injected through the space therebetween via the injection portion 630, the plasma generator 680 may be used as a guide member to block undesired impurities. To this end, the plasma generator 680 may be formed to have the same size as or to be larger than the substrate 601. For example, when the source gas S is injected through the third injection hole 633, a surplus impurity gas generated and adsorbed onto the substrate 601 when the source gas S injected through the first injection hole 631 reacts with the substrate 601 may not be completely exhausted via the exhaust port 611. In this case, a process using the source gas S injected via the third injection hole 633 may be influenced by the surplus impurity gas, thereby degrading the characteristics of a thin film to be formed on the substrate 601. However, according to the current embodiment, the source gas S is injected toward the space between the substrate 601 and the plasma generator 680 via the third injection hole 633. Thus, the plasma generator 680 may prevent the source gas S from being mixed with such a surplus impurity gas.

Accordingly, the efficiency of the deposition process of forming a desired thin film may be greatly increased. Furthermore, since undesired components may be easily prevented or blocked from being adsorbed onto the first and second substrates 801 and 802 and the purging process is not used, purge gas impurities generated when a purge gas is used may be eliminated from being deposited together with a desired thin film on the first and second substrates 601 and 602. Therefore, it is possible to form a thin film having uniform characteristics that are physically and chemically improved.

Also, in the current embodiment, a deposition process is performed while the stage 620 and the plasma generator 680 are being moved using the first and second drivers 651 and 652. Also, a plurality of deposition processes are sequentially performed using the first injection hole 631, the third injection hole 633, the fifth injection hole 635, and the plasma generator 680. Thus, it is possible to greatly reduce an amount of time required to form a thin film to a desired thickness, thereby increasing the efficiency of the deposition process.

Also, in the current embodiment, the mask 640 is disposed on the substrate 601 to help form the patterns of a thin film on the substrate 601.

Figure 10:
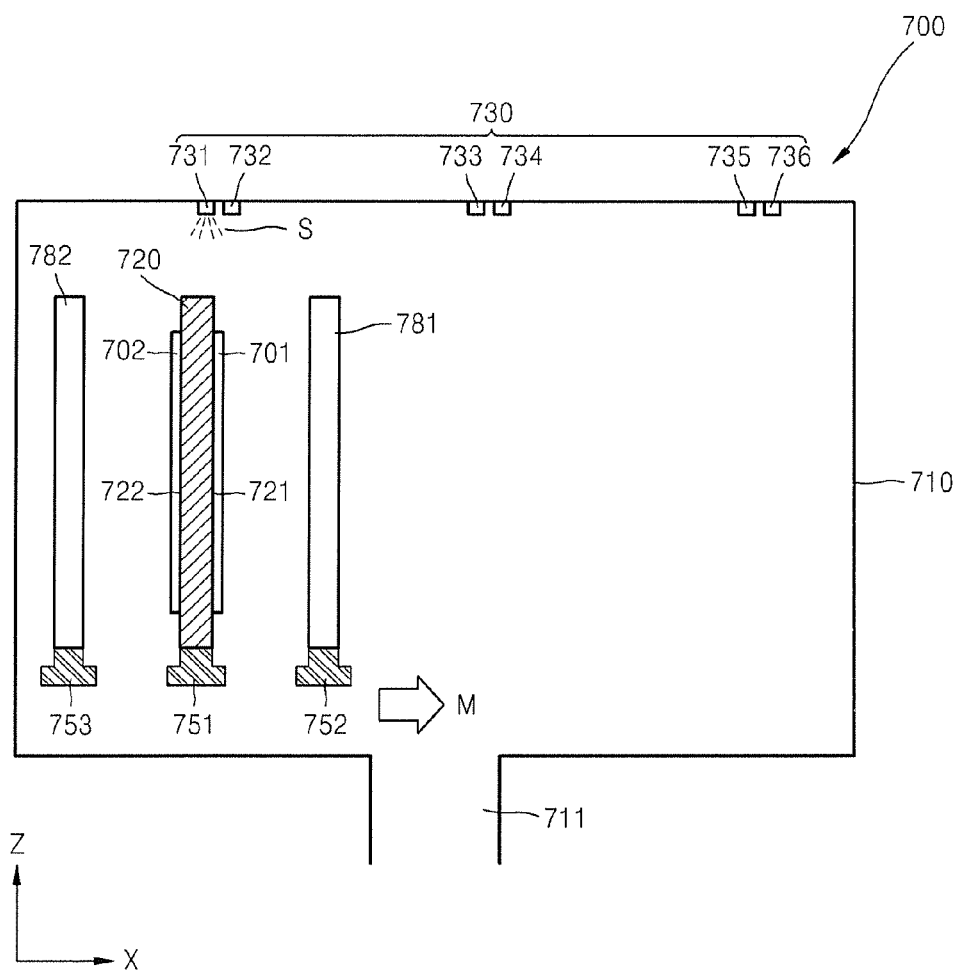
FIG. 10 is a schematic cross-section view of a vapor deposition apparatus according to another embodiment of the present invention.

FIG. 10 is a schematic cross-section view of a vapor deposition apparatus 700 according to another embodiment of the present invention. Referring to FIG. 10, the vapor deposition apparatus 700 includes a chamber 710, a stage 720, an injection portion 730, a first driver 751, a second driver 752, a third driver 753, a first plasma generator 781, and a second plasma generator 782.

The chamber 710 includes an exhaust port 711 on a bottom thereof. The exhaust port 711 is an outlet via which a gas is exhausted, and may be connected to a pump (not shown) to help exhaust the gas.

Although not shown, the pump is used to control pressure applied to the chamber 710 so that the pressure is maintained constant. A heating unit (not shown) may be disposed inside or outside the chamber 710 to heat the inside of the chamber 710, thereby enhancing the efficiency of a deposition process.

The stage 720 includes a first mounting surface 721 and a second mounting surface 722. The first and second mounting surfaces 721 and 722 are located to be parallel with a direction in which a gravitational force acts. In other words, the first and second mounting surfaces 721 and 722 are located perpendicularly to the ground. To this end, the stage 720 is disposed perpendicularly to the ground.

A first substrate 701 and a second substrate 702 are disposed on the stage 720. Specifically, the first substrate 701 and the second stage 702 are respectively mounted on the first and second mounting surfaces 721 and 722 of the stage 720.

The first and second mounting surfaces 721 and 722 are located to be parallel with each other.

A fixing unit (not shown) may be used to respectively fix the mounted first and second substrates 701 and 702 onto the first and second mounting surfaces 721 and 722. Any of various members, e.g., a clamp, a pressurizing member, and an adhesive material, may be used as the fixing unit.

The first substrate 701 and the first plasma generator 781 are disposed apart from each other to form a space therebetween, and the second substrate 702 and the second plasma generator 782 are disposed apart from each other to form a space therebetween. The first and second plasma generators 781 and 782 may be disposed in parallel with the first and second substrates 701 and 702, respectively. Also, the first plasma generator 781 may have the same size as the first substrate 701 to correspond to the first substrate 701 or may be larger than the first substrate 701. The second plasma generator 782 may have the same size as the second substrate 702 to correspond to the second substrate 702 or may be larger than the second substrate 702.

Shapes of the first and second plasma generators 781 and 782 are not limited. In other words, the first and second plasma generators 781 and 782 may have any of various shapes, provided they can receive a reaction gas, generate plasma from the reaction gas, and respectively discharge the plasma toward the first and second substrates 701 and 702. The first and second plasma generators 781 and 782 are as described above in the previous embodiments and are thus not described in detail here.

The first to third drivers 751 to 753 are respectively connected to the stage 720 and the first and second plasma generators 781 and 782. Specifically, the first driver 751 is connected to the stage 720, the second driver 752 is connected to the first plasma generator 781, and the third driver 753 is connected to the second plasma generator 782.

FIG. 10 illustrates three separate drivers, i.e., the first to third drivers 751 to 753, but aspects of the present invention are not limited thereto. In other words, one driver may be used to concurrently or simultaneously move the stage 720 and the first and second plasma generators 781 and 782.

Referring to FIG. 10, the first driver 751 moves the stage 720 in a direction indicated by an arrow M or a direction opposite to that direction. In other words, the first driver 751 moves the stage 720 in the X-axis direction. Thus, the first and second substrates 701 and 702 may be moved in a direction perpendicular to surfaces of the first and second substrates 701 and 702 on which a thin film is to be formed.

The second and third drivers 752 and 753 respectively move the first and second plasma generators 781 and 782 in the direction indicated by the arrow M or the direction opposite to that direction. In other words, the second and third drivers 752 and 853 respectively move the first and second plasma generators 781 and 782 in the X-axis direction. Thus, the first and second plasma generators 781 and 782 may be respectively moved in the directions perpendicular to the surfaces of the first and second substrates 701 and 702 on which a thin film is to be formed.

In this case, the first to third drivers 751 to 753 are controlled to maintain spaces between the first substrate 701 and the first plasma generator 781, and between the second substrate 702 and the second plasma generator 782, to be constant.

The injection portion 730 is connected to the chamber 710. At least one gas is injected toward the first and second substrates 701 and 702 via the injection portion 730. Specifically, the injection portion 730 includes a first injection hole 731, a second injection hole 732, a third injection hole 733, a fourth injection hole 734, a fifth injection hole 735, and a sixth injection hole 736.

The first to sixth injection holes 731 to 736 are arranged in a direction in which the first and second substrates 701 and 702 are moved. In other words, the first to sixth injection holes 731 to 736 are disposed apart from one another in the X-axis direction.

Shapes of the first to sixth injection holes 731 to 736 are not limited. For example, they may each be in the form of a dot or a line corresponding to a width of each of the first and second substrates 701 and 702.

Specifically, a gas is injected through the first to sixth injection holes 731 to 736 in a direction parallel with planar surfaces of the first and second substrates 701 and 702. In other words, a gas is injected through the first to sixth injection holes 731 to 736 in a direction parallel with a direction in which a gravitational force acts.

A source gas S is sequentially or concurrently or simultaneously injected through the first, third, and fifth injection holes 731, 733, and 735. The second, fourth, and sixth injection holes 732, 734, and 736 may not need to be formed since a reaction gas that is in a plasma state is injected via the first and second plasma generators 781 and 782. However, aspects of the present invention are not limited thereto, and the reaction gas may be injected through the second, fourth, and sixth injection holes 732, 734, and 736 rather than supply portions (not shown) of the first and second plasma generators 781 and 782. That is, the reaction gas may be injected through the second, fourth, and sixth injection holes 732, 734, and 736, be changed to the form of plasma within the first and second plasma generators 781 and 782, and then be injected toward the first and second substrates 701 and 702.

An operation of the vapor deposition apparatus 700 according to the current embodiment is briefly described below.

The first and second substrates 701 and 702 are mounted on the mounting surface 720 of the stage 720. Then, a source gas S is injected through the first injection hole 731 of the injection portion 730. In this case, the source gas S may be injected toward the spaces between the first substrate 701 and the first plasma generator 781 and between the second substrate 702 and the second plasma generator 782. While the source gas S is being injected, the first and second plasma generators 781 and 782 are controlled not to operate.

The source gas S is adsorbed onto the first and second substrates 701 and 702. Then, the exhaust process is performed using the exhaust port 711 to form either a single atomic layer or multiple atomic layers of the source gas S on the first and second substrates 701 and 702.

Then, a reaction gas is injected through the supply portions of the first and second plasma generators 781 and 782. When the reaction gas is injected, plasma is generated in the space between the first plasma electrode and the second plasma electrode. The plasma is discharged toward the first and second substrates 701 and 702 via the outlets of the plasma generators 781 and 782.

Thus, the plasma of the reaction gas is adsorbed onto the first and second substrates 701 and 702. Then, the exhaust process is performed using the exhaust port 711 to form either a single atomic layer or multiple atomic layers of the reaction gas on the first and second substrates 701 and 702.

Accordingly, a single atomic layer or multiple atomic layers of the source gas S and the reaction gas are formed on the first and second substrates 701 and 702.

Then, the stage 720 and the first and second plasma generators 781 and 782 are moved using the first to third drivers 751 to 753 in the X-axis direction, i.e., the direction indicated by the arrow M. Accordingly, the spaces between the first substrate 701 and the first plasma generator 781, and between the second substrate 702 and the second plasma generator 782 are maintained constant even after the stage 720 and the first and second plasma generators 781 and 782 are moved.

Then, a source gas S is injected through the third injection hole 733 of the injection portion 731. In this case, the source gas S may be injected toward the spaces between the first substrate 701 and the first plasma generator 781, and between the second substrate 702 and the second plasma generator 782. While the source gas S is being injected, the first and second plasma generators 781 and 782 are controlled not to operate.

The source gas S is adsorbed onto the first and second substrates 701 and 702. Then, the exhaust process is performed using the exhaust port 711 to form either a single atomic layer or multiple atomic layers of the source gas S on the first and second substrates 701 and 702.

Then, a reaction gas is injected through the supply portions of the first and second plasma generators 781 and 782. When the reaction gas is injected, plasma is generated in the space between the first plasma electrode and the second plasma electrode. The plasma is discharged toward the first and second substrates 701 and 702 via the outlets of the plasma generators 781 and 782.

Thus, the plasma of the reaction gas is adsorbed onto the first and second substrates 701 and 702. Then, the exhaust process is performed using the exhaust port 711 to form either a single atomic layer or multiple atomic layers of the reaction gas on the first and second substrates 701 and 702.

Accordingly, a single atomic layer or multiple atomic layers of the source gas S and the reaction gas are formed on the thin film, i.e., the single atomic layer or multiple atomic layers of the source gas S and the reaction gas, which was formed on the first and second substrates 701 and 702 by using the first injection hole 731 and the first and second plasma generators 781 and 782 before the first and second drivers 751 and 752 were driven.

Then, the stage 720 and the first and second plasma generators 781 and 782 are moved in the X-axis direction, i.e., the direction indicated by the arrow M, by using the first and second drivers 751 and 752.

Then, a thin film is additionally formed on the first and second substrates 701 and 702 by using the fifth injection hole 735 and the first and second plasma generators 781 and 782 in the same manner in which the previous thin film was formed using the first injection hole 731 and the first and second plasma generators 781 and 782.

Accordingly, it is possible to form a thin film to a desired thickness on the first and second substrates 701 and 702 in the chamber 710. In other words, moving of the stage 720 and the first and second plasma generators 781 and 782 may be controlled according to the desired thickness of the thin film.

In the current embodiment, the source gas S is injected through the injection portion 730 in a direction parallel with the upper surfaces of the first and second substrates 701 and 702. In particular, the first and second substrates 701 and 702 are disposed perpendicularly to the ground, i.e., in a direction in which a gravitational force acts. Thus, when the source gas S is supplied via the injection portion 730 to be adsorbed onto the first and second substrates 701 and 702, it is possible to reduce an unnecessarily adsorbed amount on the first and second substrates 701 and 702 when the source gas S is adsorbed onto the first and second substrates 701 and 702. Similarly, it is possible to reduce an amount of the plasma generated by the first and second plasma generators 781 and 782 that ends up being unnecessarily adsorbed onto the first and second substrates 701 and 702.

In other words, an amount of surplus components adsorbed onto the first and second substrates 701 and 702 or an uneven lump of the components drop downward due to gravity, thereby reducing the amounts of the surplus source gas S and the surplus plasma. Such surplus components may also be easily removed by performing the exhaust process using the exhaust port 711 below the first and second substrates 701 and 702. Thus, the source gas S is injected through the first injection hole 731 of the injection portion 730, the exhaust process is performed without performing a purging process using an additional purge gas, the reaction gas is injected through the first and second plasma generators 781 and 782, and the exhaust process is performed again without performing the purging process, thereby completing the deposition process.

In particular, in the current embodiment, the first and second plasma generators 781 and 782 are disposed to face the first and second substrates 701 and 702, respectively. The first and second plasma generators 781 and 782 are disposed separately from the injection portion 730 via which the source gas S is injected. Thus, the process using the source gas S and the process using the reaction gas may be performed individually, thereby easily forming a thin film that does not contain impurities.

Also, the first and second plasma generators 781 and 782 are disposed apart from the first and second substrate 701 and 702, and the source gas S is injected through the spaces between the first plasma generator 781 and the first substrate 801, and between the second plasma generator 782 and the second substrate 702 via the injection portion 730. Thus, the first and second plasma generators 781 and 782 may be used as guide members to block undesired impurities. To this end, the first and second plasma generators 781 and 782 may be formed to have the same size as or to be larger than the first and second substrate 701 and 702. For example, when the source gas S is injected through the third injection hole 733, a surplus impurity gas generated and adsorbed onto the first and second substrates 701 and 702 when the source gas S injected through the first injection hole 731 reacts with the first and second substrate 701 and 702, may not be completely exhausted via the exhaust port 711. In this case, the process using the source gas S injected via the third injection hole 733 may be influenced by the surplus impurity gas, thereby degrading the characteristics of a thin film to be formed on the first and second substrates 701 and 702. However, according to the current embodiment, the source gas S is injected toward the spaces between the first substrate 701 and the first plasma generator 781, and between the second substrate 702 and the second plasma generators 782 via the third injection hole 733. Thus, the first and second plasma generators 781 and 782 may prevent or block the source gas S from being mixed with such a surplus impurity gas.

Accordingly, the efficiency of the deposition process of forming a desired thin film may be greatly increased. Furthermore, since undesired components may be easily prevented or blocked from being adsorbed onto the first and second substrates 701 and 702 and the purging process is not used, purge gas impurities generated when a purge gas is used may be eliminated from being deposited together with a desired thin film on the first and second substrates 701 and 702. Therefore, it is possible to form a thin film having uniform characteristics that are physically and chemically improved.

Also, in the current embodiment, a deposition process is performed while the stage 720 and the first and second plasma generators 781 and 782 are being moved using the first to third drivers 751 to 753. Also, a plurality of deposition processes are sequentially performed using the first injection hole 731, the third injection hole 733, the fifth injection hole 735, and the first and second plasma generators 781 and 782. Thus, it is possible to greatly reduce an amount of time required to form a thin film to a desired thickness, thereby increasing the efficiency of the deposition process.

Also, in the current embodiment, the first and second mounting surfaces 721 and 722 are respectively formed on both surfaces of the stage 720, and the first and second substrates 701 and 702 are concurrently or simultaneously mounted on the stage 720. Accordingly, the efficiency of the deposition process may be enhanced. Furthermore, since the first and second substrates 701 and 702 are disposed on both surfaces of the stage 720 to be parallel with each other, surfaces of the first and second substrates 701 and 702 on which a thin film is to be formed are not disposed to face each other.

Thus, a deposition process performed on the first substrate 801 and a deposition process performed on the second substrate 802 are not influenced by each other. Accordingly, it is possible to form a thin film having uniform and improved characteristics on both the first and second substrates 701 and 702.

Figure 11:
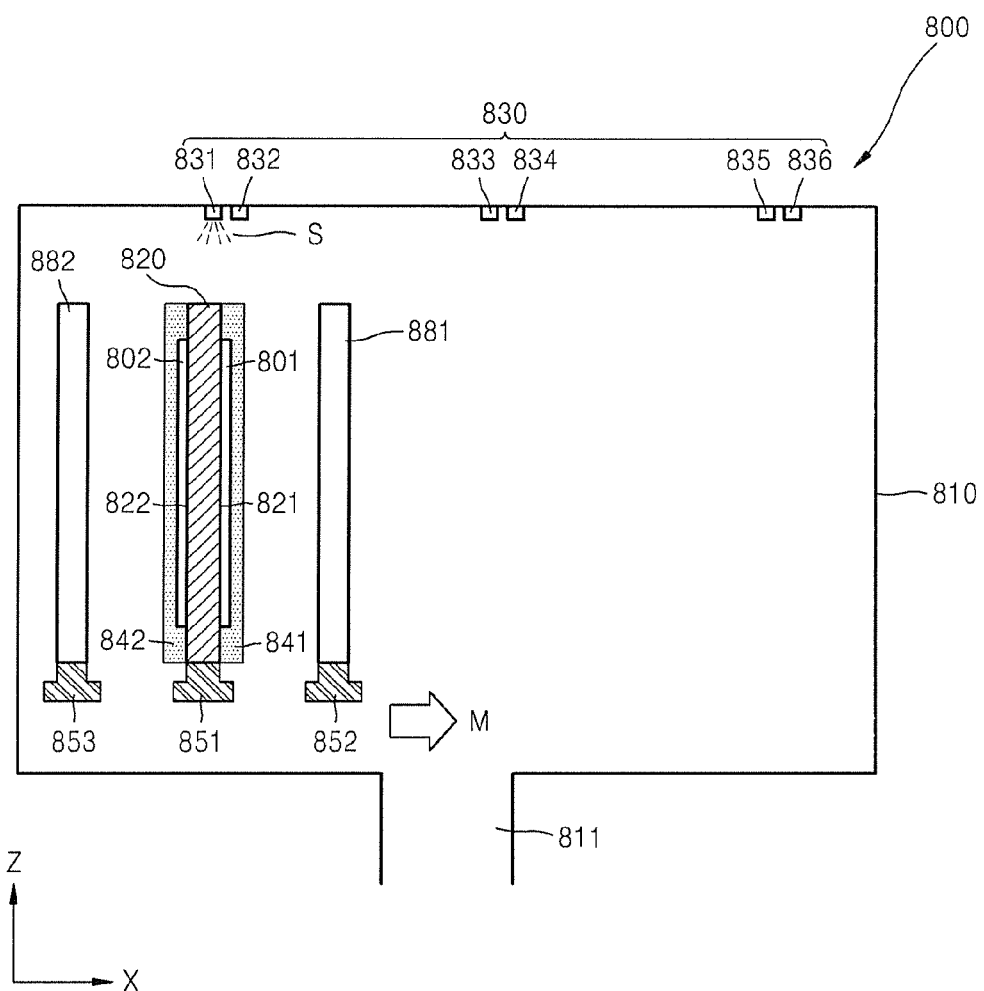
FIG. 11 is a schematic cross-sectional view of a vapor deposition apparatus according to another embodiment of the present invention.

FIG. 11 is a schematic cross-section view of a vapor deposition apparatus 800 according to another embodiment of the present invention. Referring to FIG. 11, the vapor deposition apparatus 800 includes a chamber 810, a stage 820, an injection portion 830, a first mask 841, a second mask 842, a first driver 851, a second driver 852, a third driver 853, a first plasma generator 881, and a second plasma generator 882.

The chamber 810 includes an exhaust port 811 on a bottom thereof. The exhaust port 811 is an outlet via which a gas is exhausted, and may be connected to a pump (not shown) to help exhaust the gas.

Although not shown, the pump is used to control pressure applied to the chamber 810 so that the pressure is maintained constant. A heating unit (not shown) may be disposed inside or outside the chamber 810 to heat the inside of the chamber 810, thereby enhancing the efficiency of a deposition process.

The stage 820 includes a first mounting surface 821 and a second mounting surface 822. The first and second mounting surfaces 821 and 822 are located to be parallel with a direction in which a gravitational force acts. In other words, the first and second mounting surfaces 821 and 822 are located perpendicularly to the ground. To this end, the stage 820 is disposed perpendicularly to the ground.

A first substrate 801 and a second substrate 802 are disposed on the stage 820. Specifically, the first substrate 801 and the second stage 802 are respectively mounted on the first mounting surface 821 and the second mounting surface 822 of the stage 820.

The first and second mounting surfaces 821 and 822 are located to be parallel with each other.

A fixing unit (not shown) may be used to respectively fix the mounted first and second substrates 801 and 802 onto the first and second mounting surfaces 821 and 822. Any of various members, e.g., a clamp, a pressurizing member, and an adhesive material, may be used as the fixing unit.

The first substrate 801 and the first plasma generator 881 are disposed apart from each other to form a space therebetween, and the second substrate 802 and the second plasma generator 882 are disposed apart from each other to form a space therebetween. The first and second plasma generators 881 and 882 may be disposed in parallel with the first and second substrates 801 and 802, respectively. Also, the first plasma generator 881 may have the same size as the first substrate 801 to correspond to the first substrate 801 or may be larger than the first substrate 801, and the second plasma generator 882 may have the same size as the second substrate 802 to correspond to the second substrate 802 or may be larger than the second substrate 802.

The first and second masks 841 and 842 are disposed on the first and second substrates 801 and 802. Specifically, the first and second masks 841 and 842 may be respectively disposed on the first and second substrates 801 and 802.

Although not shown, each of the first and second masks 841 and 842 includes apertures as in the previous embodiments. Each of the apertures has a shape corresponding to a respective one of patterns of a thin film to be formed on each of the first and second substrates 801 and 802.

Shapes of the first and second plasma generators 881 and 882 are not limited. In other words, the first and second plasma generators 881 and 882 may have any of various shapes, provided they can receive a reaction gas, generate plasma from the reaction gas, and respectively discharge the plasma toward the first and second substrates 801 and 802. The first and second plasma generators 881 and 882 are as described above in the previous embodiments and are thus not described in detail here.

The first to third drivers 851 to 853 are respectively connected to the stage 820 and the first and second plasma generators 881 and 882. Specifically, the first driver 851 is connected to the stage 820, the second driver 852 is connected to the first plasma generator 881, and the third driver 853 is connected to the second plasma generator 882.

FIG. 11 illustrates three separate drivers, i.e., the first to third drivers 851 to 853, but aspects of the present invention are not limited thereto. In other words, one driver may be used to concurrently or simultaneously move the stage 820 and the first and second plasma generators 881 and 882.

Referring to FIG. 11, the first driver 851 moves the stage 820 in a direction indicated by an arrow M or a direction opposite to that direction. In other words, the first driver 851 moves the stage 820 in the X-axis direction. Thus, the first and second substrates 801 and 802 may be moved in a direction perpendicular to surfaces of the first and second substrates 801 and 802 on which a thin film is to be formed.

The second and third drivers 852 and 853 respectively move the first and second plasma generators 881 and 882 in the direction indicated by the arrow M or the direction opposite to that direction. In other words, the second and third drivers 852 and 853 respectively move the first and second plasma generators 881 and 882 in the X-axis direction. Thus, the first and second plasma generators 881 and 882 may be respectively moved in the directions perpendicular to the surfaces of the first and second substrates 801 and 802 on which a thin film is to be formed.

In this case, the first to third drivers 851 to 853 are controlled to maintain spaces between the first substrate 801 and the first plasma generator 881, and between the second substrate 802 and the second plasma generator 882, to be constant.

The injection portion 830 is connected to the chamber 810. At least one gas is injected toward the first and second substrates 801 and 802 via the injection portion 830. Specifically, the injection portion 830 includes a first injection hole 831, a second injection hole 832, a third injection hole 833, a fourth injection hole 834, a fifth injection hole 835, and a sixth injection hole 836.

The first to sixth injection holes 831 to 836 are arranged in a direction in which the first and second substrates 801 and 802 are moved. In other words, the first to sixth injection holes 831 to 836 are disposed apart from one another in the X-axis direction.

Shapes of the first to sixth injection holes 831 to 836 are not limited. For example, they may each be in the form of a dot or a line corresponding to a width of each of the first and second substrates 801 and 802.

A gas is injected through the first to sixth injection holes 831 to 836 in a direction parallel with planar surfaces of the first and second substrates 801 and 802. In other words, a gas is injected through the first to sixth injection holes 831 to 836 in a direction parallel with a direction in which a gravitational force acts.

Specifically, a source gas S is sequentially or concurrently or simultaneously injected through the first, third, and fifth injection holes 831, 833, and 835. The second, fourth, and sixth injection holes 832, 834, and 836 may not need to be formed since a reaction gas that is in a plasma state is injected via the first and second plasma generators 881 and 882. However, aspects of the present invention are not limited thereto, and the reaction gas may be injected through the second, fourth, and sixth injection holes 832, 834, and 836 rather than supply portions (not shown) of the first and second plasma generators 881 and 882. That is, the reaction gas may be injected through the second, fourth, and sixth injection holes 832, 834, and 836, be changed to the form of plasma within the first and second plasma generators 881 and 882, and then be injected toward the first and second substrates 801 and 802.

An operation of the vapor deposition apparatus 800 according to the current embodiment is briefly described below.

The first and second substrates 801 and 802 are mounted on the mounting surface 821 of the stage 820. The first mask 841 including apertures (not shown) corresponding to patterns of a thin film that is to be deposited on the first substrate 801, is disposed on the first substrate 802. The second mask 842 including apertures (not shown) corresponding to patterns of a thin film that is to be deposited on the second substrate 802, is disposed on the second substrate 802.

Then, a source gas S is injected through the first injection hole 831 of the injection portion 830. In this case, the source gas S may be injected toward the spaces between the first substrate 801 and the first plasma generator 881, and between the second substrate 802 and the second plasma generator 882. While the source gas S is being injected, the first and second plasma generators 881 and 882 are controlled not to operate.

The source gas S is adsorbed onto the first and second substrates 801 and 802. In particular, the source gas S is adsorbed onto regions on the first and second substrates 801 and 802, which correspond to the apertures. Then, the exhaust process is performed using the exhaust port 811 to form either a single atomic layer or multiple atomic layers of the source gas S on the first and second substrates 801 and 802.

Then, a reaction gas is injected through the supply portions of the first and second plasma generators 881 and 882. When the reaction gas is injected, plasma is generated in the space between the first plasma electrode and the second plasma electrode. The plasma is discharged toward the first and second substrates 801 and 802 via the outlets of the plasma generators 881 and 882.

The plasma of the reaction gas is adsorbed onto the regions on the first and second substrates 801 and 802 corresponding to the apertures. Then, the exhaust process is performed using the exhaust port 811 to form either a single atomic layer or multiple atomic layers of the reaction gas on the regions on the first and second substrates 801 and 802 corresponding to the apertures.

Accordingly, a single atomic layer or multiple atomic layers of the source gas S and the reaction gas are formed on the regions of the first and second substrates 801 and 802 corresponding to the apertures.

Then, the stage 820 and the first and second plasma generators 881 and 882 are moved in the X-axis direction, i.e., the direction indicated by the arrow M, by using the first to third drivers 851 to 853. Accordingly, the spaces between the first substrate 801 and the first plasma generator 881, and between the second substrate 802 and the second plasma generator 882 are maintained constant even after the stage 820 and the first and second plasma generators 881 and 882 are moved.

Then, a source gas S is injected through the third injection hole 833 of the injection portion 830. In this case, the source gas S may be injected toward the spaces between the first substrate 801 and the first plasma generator 881, and between the second substrate 802 and the second plasma generator 882. While the source gas S is being injected, the first and second plasma generators 881 and 882 are controlled not to operate.

The source gas S is adsorbed onto the first and second substrates 801 and 802. Then, the exhaust process is performed using the exhaust port 811 to form either a single atomic layer or multiple atomic layers of the source gas S on the first and second substrates 801 and 802.

Then, a reaction gas is injected through the supply portions of the first and second plasma generators 881 and 882. When the reaction gas is injected, plasma is generated in the space between the first plasma electrode and the second plasma electrode. The plasma is discharged toward the first and second substrates 801 and 802 via the outlets of the plasma generators 881 and 882.

Thus, the plasma of the reaction gas is adsorbed onto the first and second substrates 801 and 802. Then, the exhaust process is performed using the exhaust port 811 to form either a single atomic layer or multiple atomic layers of the reaction gas on the first and second substrates 801 and 802.

Accordingly, a single atomic layer or multiple atomic layers of the source gas S and the reaction gas are formed on the thin film, i.e., the single atomic layer of or multiple atomic layers of the source gas S and the reaction gas, which was formed on the first and second substrates 801 and 802 by using the first injection hole 831 and the first and second plasma generators 881 and 882 before the first and second drivers 851 and 852 were driven.

Then, the stage 820 and the first and second plasma generators 881 and 882 are moved in the X-axis direction, i.e., the direction indicated by the arrow M, by using the first to third second drivers 851 to 853.

Then, a thin film is additionally formed on the first and second substrates 801 and 802 by using the fifth injection hole 835 and the first and second plasma generators 881 and 782 in the same manner in which the previous thin film was formed using the first injection hole 831 and the first and second plasma generators 882 and 881.

Accordingly, it is possible to form a thin film to a desired thickness on the first and second substrates 801 and 802 in the chamber 810. In other words, moving of the stage 820 and the first and second plasma generators 881 and 882 may be controlled according to the desired thickness of the thin film.

In the current embodiment, the source gas S is injected through the injection portion 830 in a direction parallel with upper surfaces of the first and second substrates 801 and 802. In particular, the first and second substrates 801 and 802 are disposed perpendicularly to the ground, i.e., in a direction in which a gravitational force acts. Thus, when the source gas S is supplied via the injection portion 830 to be adsorbed onto the first and second substrates 801 and 802, it is possible to reduce an unnecessarily adsorbed amount on the first and second substrates 801 and 802 when the source gas S is adsorbed onto the first and second substrates 801 and 802. Similarly, it is possible to reduce an amount of the plasma generated by the first and second plasma generators 881 and 882 that ends up being unnecessarily adsorbed onto the first and second substrates 801 and 802.

In other words, an amount of surplus components adsorbed onto the first and second substrates 801 and 802 or an uneven lump of the components drop downward due to gravity, thereby reducing the amounts of the surplus source gas S and the surplus plasma. Such surplus components may also be easily removed by performing the exhaust process using the exhaust port 811 below the first and second substrates 801 and 802. Thus, the source gas S is injected through the first injection hole 831 of the injection portion 830, the exhaust process is performed without performing a purging process using an additional purge gas, the reaction gas is injected through the first and second plasma generators 881 and 882, and the exhaust process is performed again without performing the purging process, thereby completing the deposition process.

In particular, in the current embodiment, the first and second plasma generators 881 and 882 are disposed to face the first and second substrates 801 and 802, respectively. The first and second plasma generators 881 and 882 are disposed separately from the injection portion 830 via which the source gas S is injected. Thus, the process using the source gas S and the process using the reaction gas may be performed individually, thereby easily forming a thin film that does not contain impurities.

Also, the first and second plasma generators 881 and 882 are disposed apart from the first and second substrate 801 and 802, and the source gas S is injected through the spaces between the first plasma generator 881 and the first substrate 801, and between the second plasma generator 882 and the second substrate 802 via the injection portion 830. Thus, the first and second plasma generators 881 and 882 may be used as guide members to block undesired impurities. To this end, the first and second plasma generators 881 and 882 may be formed to have the same size as or to be larger than the first and second substrates 801 and 802. For example, when the source gas S is injected through the third injection hole 833, a surplus impurity gas generated and adsorbed onto the first and second substrates 801 and 802 when the source gas S injected through the first injection hole 831 reacts with the first and second substrate 801 and 802 may not be completely exhausted via the exhaust port 811. In this case, the process using the source gas S injected via the third injection hole 833 may be influenced by the surplus impurity gas, thereby degrading the characteristics of a thin film to be formed on the first and second substrates 801 and 802. However, according to the current embodiment, the source gas S is injected toward the spaces between the first substrate 801 and the first plasma generator 881, and between the second substrate 802 and the second plasma generators 882 via the third injection hole 833. Thus, the first and second plasma generators 881 and 882 may prevent or block the source gas S from being mixed with such a surplus impurity gas.

Accordingly, the efficiency of the deposition process of forming a desired thin film may be greatly increased. Furthermore, since undesired components may be easily prevented or blocked from being adsorbed onto the first and second substrates 801 and 802 and the purging process is not used, purge gas impurities generated when a purge gas is used may be eliminated from being deposited together with a desired thin film on the first and second substrates 801 and 802. Therefore, it is possible to form a thin film having uniform characteristics that are physically and chemically improved.

Also, in the current embodiment, the deposition process is performed while the stage 820 and the first and second plasma generators 881 and 882 are being moved using the first to third drivers 851 to 853. Also, a plurality of deposition processes are sequentially performed using the first injection hole 831, the third injection hole 833, the fifth injection hole 835, and the first and second plasma generators 881 and 882. Thus, it is possible to greatly reduce an amount of time required to form a thin film to a desired thickness, thereby increasing the efficiency of the deposition process.

Also, in the current embodiment, the first and second mounting surfaces 821 and 822 are respectively formed on both surfaces of the stage 820, and the first and second substrates 801 and 802 are concurrently or simultaneously mounted on the stage 820. Accordingly, the efficiency of the deposition process may be enhanced. Furthermore, since the first and second substrates 801 and 802 are disposed on both surfaces of the stage 820 to be parallel with each other, surfaces of the first and second substrates 801 and 802 on which a thin film is to be formed are not disposed to face each other. Thus, a deposition process performed on the first substrate 801 and a deposition process performed on the second substrate 802 are not influenced by each other. Accordingly, it is possible to form a thin film having uniform and improved characteristics on both the first and second substrates 801 and 802.

Also, in the current embodiment, the first and second masks 841 and 842 are disposed on the first and second substrates 801 and 802 to help form the patterns of thin films on the first and second substrates 801 and 802.

Figure 12:
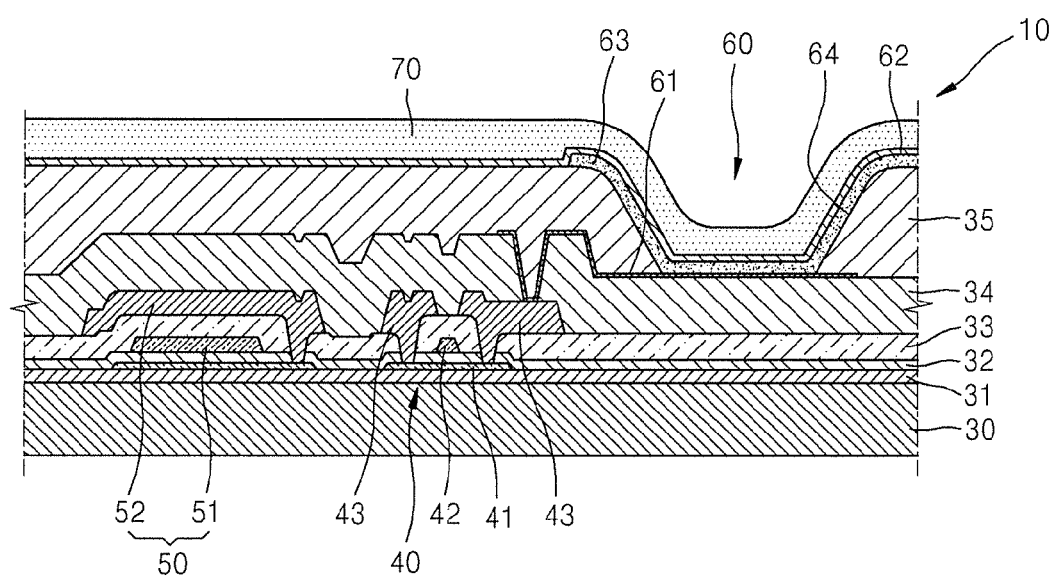
FIG. 12 is a schematic cross-sectional view of an organic light-emitting display apparatus manufactured based a method of manufacturing an organic light-emitting display apparatus according to an embodiment of the present invention.

FIG. 12 is a schematic cross-sectional view of an organic light-emitting display apparatus manufactured based on a method of manufacturing the organic light-emitting display apparatus according to an embodiment of the present invention. Specifically, FIG. 12 illustrates an organic light-emitting display apparatus manufactured using one of the vapor deposition apparatuses 100 to 800 according to the various embodiments of the present invention described above.

Referring to FIG. 12, the organic light-emitting display apparatus 10 is formed on a substrate 30. The substrate 30 may be formed of, for example, glass, plastic, or metal. On the substrate 30, a buffer layer 31 is formed to provide a planarized surface on the substrate 30 and to protect the substrate 30 from moisture or foreign substances.

A thin film transistor (TFT) 40, a capacitor 50, and an organic light-emitting device (OLED) 60 are disposed on the buffer layer 31. The TFT 40 includes an active layer 41, a gate electrode 42, and a source/drain electrode 43. The OLED 60 includes a first electrode 61, a second electrode 62, and an intermediate layer 63.

In detail, the active layer 41 is formed to have a suitable pattern (e.g., a predetermined pattern) on the buffer layer 31. The active layer 41 may include a p-type or n-type semiconductor material. A gate insulating layer 32 is formed on the active layer 41. The gate electrode 42 is formed on a region of the gate insulating layer 32 corresponding to the active layer 41. An interlayer insulating layer 33 is formed covering the gate electrode 42, and the source/drain electrode 43 is disposed on the interlayer insulating layer 33 to contact a suitable region (e.g., a predetermined region) of the active layer 41. A passivation layer 34 is formed covering the source/drain electrode 43, and an additional insulating layer (not shown) may be formed on the passivation layer 34 to planarize the passivation layer 34.

The first electrode 61 is formed on the passivation layer 34. The first electrode 61 is electrically connected to the drain electrode 43. A pixel defining layer 35 is formed covering the first electrode 61. An opening 64 is formed in the pixel defining layer 35, and the intermediate layer 63 including an organic emission layer (not shown) is formed in a region defined by the opening 64. The second electrode 62 is formed on the intermediate layer 63.

An encapsulating layer 70 is formed on the second electrode 62. The encapsulating layer 70 may contain an organic or inorganic material, and may have a structure in which an organic layer and an inorganic layer are alternately stacked.

The encapsulating layer 70 may be formed using one of the vapor deposition apparatuses 100 to 800. In other words, the encapsulating layer 70 may be formed by moving the substrate 30 on which the second electrode 20 is formed into a chamber (not shown) and then performing a vapor deposition process on the substrate 30 as described above.

However, aspects of the present invention are not limited thereto. For example, insulating layers included in the organic light-emitting display apparatus 10, e.g., the buffer layer 31, the gate insulating layer 32, the interlayer insulating layer 33, the passivation layer 34, and the pixel defining layer 35, may be formed by using a vapor deposition apparatus according to an embodiment of the present invention.

In addition, various conductive thin films, e.g., the active layer 41, the gate electrode 42, the source/drain electrode 43, the first electrode 61, the intermediate layer 63, and the second electrode 62, may also be formed using a vapor deposition apparatus according to an embodiment of the present invention.

With a vapor deposition apparatus and method and a method of manufacturing an organic light-emitting display apparatus according to an embodiment of the present invention, it is possible to efficiently perform a deposition process and to easily improve characteristics of a thin film.

While this invention has been particularly shown and described with reference to exemplary embodiments thereof, it will be understood by those of ordinary skill in the art that various changes in form and details may be made therein without departing from the spirit and scope of the invention as defined by the appended claims, and their equivalents.

What is claimed is:

1. A vapor deposition method of forming a thin film on a substrate, the vapor deposition method comprising:
mounting the substrate on a mounting surface of a movable stage disposed in a chamber;
injecting a source gas toward a space between the substrate and a movable plasma generator disposed to face the substrate via an injection portion and in a direction parallel with a surface of the substrate on which the thin film is to be deposited;
performing an exhaust process by using an exhaust port of the chamber;
generating plasma by using the plasma generator to discharge the plasma toward the substrate;
performing another exhaust process by using the exhaust port of the chamber; and
moving both the plasma generator and the stage with the substrate mounted thereon,
wherein the mounting surface is positioned in parallel with a direction in which a gravitational force acts.

2. The vapor deposition method of claim 1, wherein the plasma generator comprises:
a supply portion;
a first plasma electrode;
a second plasma electrode spaced apart from the first plasma electrode; and
an outlet,
wherein a reaction gas is supplied to the plasma generator via the supply portion, is changed into plasma via the first and second plasma electrodes, and is then discharged toward the substrate via the outlet of the plasma generator.

3. The vapor deposition method of claim 1, wherein a reaction gas is supplied to the plasma generator via the injection portion, is changed into plasma via the plasma generator, and is then discharged toward the substrate.

4. The vapor deposition method of claim 3, wherein the injection portion comprises an injection hole, and
the source gas and the reaction gas are sequentially injected via the injection hole.

5. The vapor deposition method of claim 3, wherein the injection portion comprises a plurality of injection holes, and
the source gas and the reaction gas are injected via different injection holes.

6. The vapor deposition method of claim 1, wherein the exhaust process is performed using a pump.

7. The vapor deposition method of claim 1, wherein the mounting of the substrate comprises disposing a mask on the substrate, wherein the mask has apertures for depositing the thin film in a desired pattern on the substrate.

8. The vapor deposition method of claim 1, wherein a deposition process is performed while the substrate mounted on the stage is moved concurrently with the plasma generator within the chamber in a direction perpendicular to the surface of the substrate on which the thin film is to be deposited.

9. The vapor deposition method of claim 1, wherein the stage comprises a plurality of mounting surfaces, wherein, during the mounting of the substrate on the stage, a plurality of substrates are respectively mounted on the plurality of mounting surfaces of the stage.

10. The vapor deposition method of claim 9, wherein a plurality of plasma generators are disposed to correspond to the plurality of substrates.

11. A method of manufacturing an organic light-emitting display apparatus in which a thin film is formed on a substrate, and comprising a first electrode, a second electrode, and an intermediate layer having an organic emission layer between the first electrode and the second electrode, the method comprising:

mounting the substrate on a mounting surface of a movable stage disposed in a chamber;

injecting a source gas toward a space between the substrate and a movable plasma generator disposed to face the substrate via an injection portion and in a direction parallel with a surface of the substrate on which the thin film is to be deposited;

performing an exhaust process by using an exhaust port of the chamber;

generating plasma by using the plasma generator to discharge the plasma toward the substrate to form a layer of the thin film;

performing another exhaust process by using the exhaust port of the chamber; and moving both the plasma generator and the stage with the substrate mounted thereon, wherein the mounting surface is positioned in parallel with a direction in which a gravitational force acts.

12. The method of claim 11, wherein the method forms an encapsulating layer on the second electrode.

13. The method of claim 11, wherein the layer of the thin film is an insulating layer.

14. The method of claim 11, wherein the layer of the thin film is a conductive layer.

* * * * *